(12) United States Patent
Kim et al.

(10) Patent No.: US 8,553,484 B2
(45) Date of Patent: Oct. 8, 2013

(54) SEMICONDUCTOR MEMORY DEVICE FOR DATA SENSING

(75) Inventors: Sua Kim, Seongnam-si (KR); Chul-Woo Park, Yongin-si (KR); Hong-Sun Hwang, Suwon-si (KR); Hak-Soo Yu, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 198 days.

(21) Appl. No.: 13/238,553

(22) Filed: Sep. 21, 2011

(65) Prior Publication Data

US 2012/0087177 A1    Apr. 12, 2012

(30) Foreign Application Priority Data

Oct. 12, 2010    (KR) .................. 10-2010-0099034

(51) Int. Cl.
*G11C 7/00* (2006.01)

(52) U.S. Cl.
USPC ........................ 365/207; 365/149; 365/203

(58) Field of Classification Search
USPC .................. 365/203, 205, 207, 226, 149
See application file for complete search history.

(56) References Cited

U.S. PATENT DOCUMENTS

| 6,337,824 B1 * | 1/2002 | Kono et al. ............... 365/207 |
| 2006/0221666 A1 * | 10/2006 | Kang et al. ............... 365/149 |
| 2009/0268510 A1 * | 10/2009 | Barth et al. ............... 365/149 |

FOREIGN PATENT DOCUMENTS

| JP | 2004-265533 | 9/2004 |
| JP | 2008-217944 | 9/2008 |
| KR | 1020060038561 A | 5/2006 |

* cited by examiner

*Primary Examiner* — Son Dinh
*Assistant Examiner* — Hien Nguyen
(74) *Attorney, Agent, or Firm* — Muir Patent Consulting, PLLC

(57) ABSTRACT

A semiconductor memory device includes a memory cell and a first reference memory cell. The memory cell includes a first switching element and a first capacitor for storing data. The first switching element is controlled by a first wordline, and has a first terminal connected to a first terminal of the first capacitor and a second terminal connected to a first bitline. The first capacitor has a second terminal for receiving a first plate voltage. The first reference memory cell includes a first reference switching element and a first capacitor. The first switching element is controlled by a first reference wordline, and has a first terminal connected to a first terminal of the first reference capacitor and a second terminal connected to a second bitline. The first reference capacitor has a second terminal receiving a first reference plate voltage different from the first plate voltage.

24 Claims, 21 Drawing Sheets

SEMICONDUCTOR MEMORY DEVICE FOR DATA SENSING

CROSS-REFERENCE TO RELATED APPLICATIONS

This application claims priority under 35 USC §119 to Korean Patent Application No. 10-2010-0099034, filed on Oct. 12, 2010 in the Korean Intellectual Property Office (KIPO), the contents of which are herein incorporated by reference in their entirety.

BACKGROUND

1. Technical Field

Example embodiments relate to semiconductor memory devices, and more particularly to semiconductor memory devices for precharging bitlines to a power supply voltage level.

2. Description of the Related Art

Semiconductor memory devices include memory cells for storing data, bitlines for connecting the memory cells and peripheral circuits for transferring data, and a bitline sense amplifier for sensing signals passing through the bitlines.

In general, the bitlines are precharged to a half level of a power supply voltage, such as Vdd/2. The bitline sense amplifier determines the data stored in the memory cell as "0" or "1" by comparing a level of a bitline of a corresponding memory cell with a level of a complementary bitline.

However, a data sensing margin is more and more decreased as the level of the power supply voltage is more and more decreased, making it more difficult to determine the data stored in the memory cell.

SUMMARY

Some example embodiments provide a semiconductor memory device capable of increasing a data sensing margin.

According to some example embodiments, a semiconductor memory device includes a memory cell and a first reference memory cell. The memory cell includes a first switching element and a first capacitor for storing data. The first switching element is controlled by a first wordline, and has a first terminal connected to a first terminal of the first capacitor and a second terminal connected to a first bitline. The first capacitor has a second terminal for receiving a first plate voltage. The first reference memory cell includes a first reference switching element and a first reference capacitor. The first reference switching element is controlled by a first reference wordline, and has a first terminal connected to a first terminal of the first reference capacitor and a second terminal connected to a second bitline. The first reference capacitor has a second terminal for receiving a first reference plate voltage different from the first plate voltage.

In some embodiments, the first and second bitlines may be precharged to a level of a power supply voltage or a level of a ground voltage.

The first and second bitlines may operate complementarily to each other.

The first plate voltage may be maintained at a fixed level and the first reference plate voltage may be changed when the first memory cell is enabled.

The first plate voltage may have an intermediate voltage level between the power supply voltage and the ground voltage and the first reference plate voltage may be maintained at a level of the power supply voltage or the ground voltage when the first memory cell is not enabled.

The first plate voltage is maintained at a level of a precharge voltage and the second plate voltage may be varied to have a different level from the precharge voltage when the first memory cell is enabled.

The first plate voltage is maintained at a level of a precharge voltage, and the first reference plate voltage is changed to have a level different from the precharge voltage, when the first memory cell is enabled.

In some embodiments, the semiconductor memory device may further include a second reference memory cell including a second reference switching element and a second reference capacitor. The second reference switching element may be controlled by a second reference wordline, and may have a first terminal connected to a first terminal of the second reference capacitor and a second terminal connected to a third bitline. The second reference capacitor may have a second terminal.

The second bitline and the third bitline may be connected to each other in response to a control signal.

The semiconductor memory device may further include an averaging circuit that connects the second and third bitlines to average voltage levels of the second and third bitlines in response to the control signal.

The second and third wordlines may be connected to each other.

According to some example embodiments, a semiconductor memory device includes a first memory cell, a first reference memory cell, a second memory cell and a second reference memory cell. The first memory cell includes a first switching element and a first capacitor for storing data. The first switching element is controlled by a first wordline, and has a first terminal connected to a first terminal of the first capacitor and a second terminal connected to a first bitline. The first capacitor has a second terminal for receiving a first plate voltage. The first reference memory cell includes a first reference switching element and a first reference capacitor. The first reference switching element is controlled by a first reference wordline, and has a first terminal connected to a first terminal of the first reference capacitor and a second terminal connected to the first bitline. The first reference capacitor has a second terminal for receiving a second plate voltage. The second memory cell includes a second switching element and a second capacitor for storing data. The second switching element is controlled by a second wordline, and has a first terminal connected to a first terminal of the second capacitor and a second terminal connected to a second bitline. The second capacitor has a second terminal for receiving the first plate voltage. The second reference memory cell includes a second reference switching element and a second reference capacitor. The second reference switching element is controlled by a second reference wordline, and has a first terminal connected to a first terminal of the second reference capacitor and a second terminal connected to the second bitline. The second reference capacitor has a second terminal for receiving a second reference plate voltage.

In some embodiments, the first and second bitlines may be precharged to a level of a power supply voltage or a level of a ground voltage.

The first and second bitlines may operate complementarily to each other, the first memory cell and the second reference memory cell may be simultaneously enabled, and the second memory cell and the first reference memory cell may be simultaneously enabled.

When the first memory cell or the second memory cell is enabled, a level of the first plate voltage is maintained at a fixed voltage level, and a level of the second reference plate voltage or the first reference plate voltage is changed, respectively.

When the first memory cell or the second memory cell is enabled, the first plate voltage has an intermediate voltage level between the power supply voltage and the ground voltage, and a level of the second reference plate voltage or the first reference plate voltage is changed, respectively.

When the first memory cell or the second memory cell is enabled, the first plate voltage has an intermediate voltage level between the power supply voltage and the ground voltage, and a level of the first plate voltage has a level of the power supply voltage or the ground voltage.

In some embodiments, the semiconductor memory device further includes a third reference memory cell including a third reference switching element and a third reference capacitor. The third reference switching element is controlled by a third reference wordline, the third reference switching element has a first terminal connected to a first terminal of the third reference capacitor and a second terminal connected to a third bitline, and the second capacitor has a second terminal for receiving the first reference plate voltage.

The first bitline and the third bitline are connected to each other in response to a first control signal.

In some embodiments, the semiconductor memory device further includes a first averaging circuit that connects the first and third bitlines in response to the first control signal.

The first reference wordline and the third reference wordline are connected to each other.

In some embodiments, the semiconductor memory device further includes a fourth reference memory cell including a fourth reference switching element and a fourth reference capacitor. The fourth reference switching element is controlled by a fourth reference wordline, the fourth reference switching element has a first terminal connected to a first terminal of the fourth reference capacitor and a second terminal connected to a fourth bitline, and the fourth reference capacitor has a second terminal.

The second bitline and the fourth bitline are connected to each other in response to a second control signal.

The semiconductor memory device further includes a second averaging circuit that connects the second and fourth bitlines in response to the second control signal.

The second reference wordline and the fourth reference wordline are connected to each other.

Accordingly, the semiconductor memory device may increase data sensing margin while minimizing additional hardwares to enhance credibility of operation of the semiconductor memory device.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
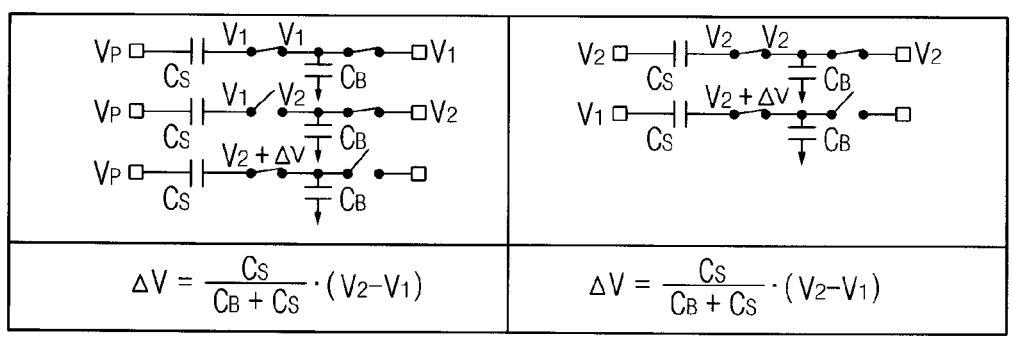
FIG. 1 is a schematic diagram for illustrating certain exemplary embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms, such as "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments, bitlines of a semiconductor memory device may be precharged to a power supply voltage level or a ground voltage level. For this purpose, each of the bitlines is connected to a reference cell having a same configuration as a main cell (for example, each reference cell includes one transistor and one capacitor), a plate voltage of the reference cell is separated from a plate voltage of the main cell, and data is sensed through charge sharing and capacitive coupling.

FIG. 1 is a schematic diagram for illustrating exemplary embodiments of the disclosure.

In writing data to memory cells of DRAM, a charge sharing operation between a cell capacitor and a bitline capacitor after charge sampling corresponds to a kind of uni-polar coupling for sampling a coupling input voltage in an output terminal.

Hereinafter, there will be description about voltage change when electrical charges are sampled and shared with reference to FIG. 1.

First, a voltage V1 is sampled in a cell capacitor CS through data write operation, and the voltage V1 corresponds to a data to be stored in a memory cell. A voltage V2 of a bitline capacitor CB is precharged to a voltage VBL, and a voltage of a bitline is changed to a voltage V2+ΔV by sharing the voltage V1 of the cell capacitor CS and the voltage V2 of the bitline capacitor CB.

With regard to a capacitive coupling, a voltage V2 is sampled in the cell capacitor CS, and the voltage V2 corresponds to a data to be stored in a memory cell. A voltage of a bitline is changed to V2+ΔV through the capacitive coupling caused by changing a plate voltage VP from the voltage V2 to the voltage V1.

According to example embodiments, plate voltages of a main cell and a reference cell are separated, and the plate voltage of the reference cell is controlled to have an unfixed level. Therefore, the plate voltage of the reference cell may follow a voltage change due to charge sharing.

The main cell may be also referred to as a memory cell, and the reference cell is also referred to as a reference memory cell.

Figure 2:
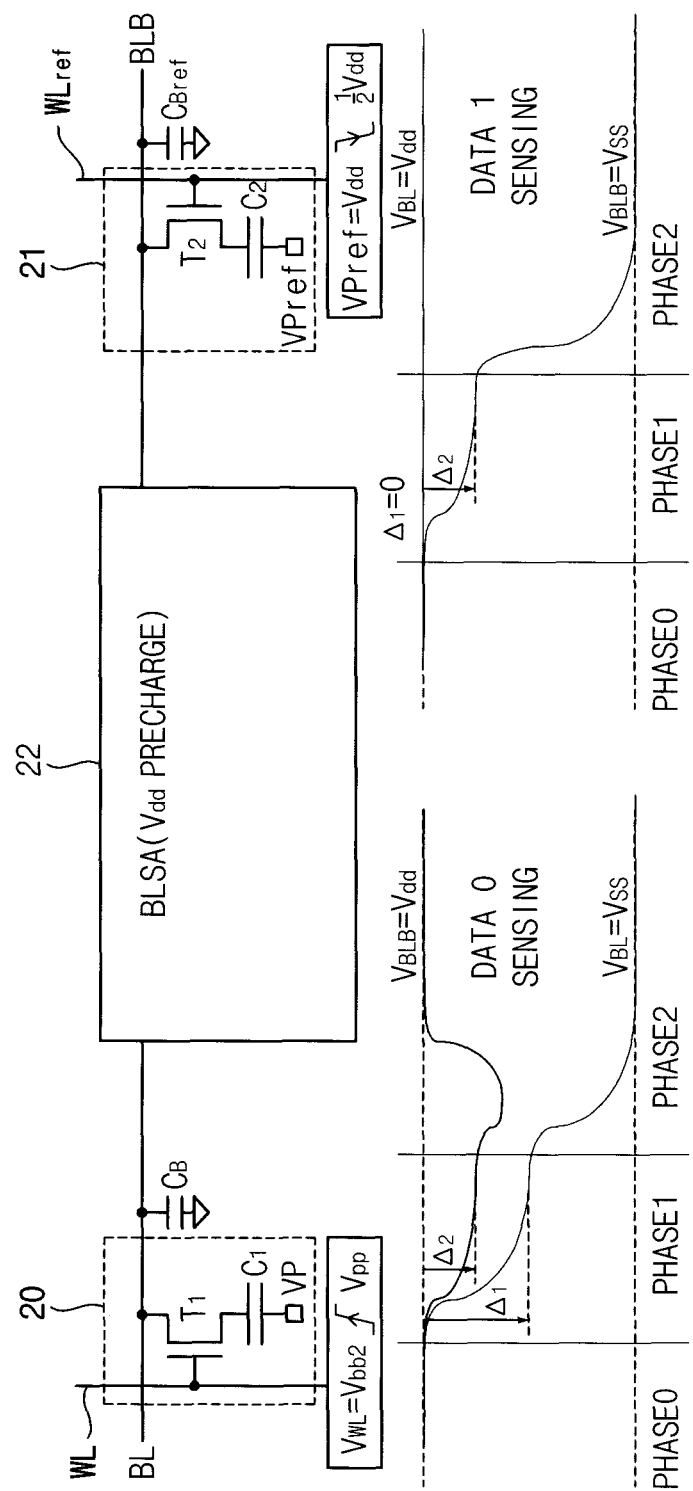
FIG. 2 illustrates data sensing operation in the semiconductor memory device according to some example embodiments.

FIG. 2 illustrates data sensing operation in the semiconductor memory device according to some example embodiments.

Referring to FIG. 2, a main cell (a memory cell) 20 is arranged at an area intersected by a wordline WL and a bitline BL, and a reference cell (also referred to as a reference memory cell) 21 is arranged at an area intersected by a reference wordline WLref and a complementary bitline BLB. A bitline sense amplifier (BLSA) 22 is connected between the bitline BL and the complementary bitline BLB, and senses and amplifies data '0' or data '1' transferred through the bitline BL and the complementary bitline BLB.

Although only one main cell 20 is shown as connected to the bitline BL and only one reference cell is shown as connected to the complementary bitline BLB in FIG. 2, additional reference cells and additional main cells may be further connected to the bitline BL, and additional main cells and additional reference cells may be further connected to the complementary bitline BLB.

The main cell 20 includes a switching transistor (also referred to as a switch or switching element) T1 having a gate controlled by the wordline WL and a drain (second terminal) connected to the bitline BL, and a main capacitor C1 connected between a main plate voltage (or main plate electrode) VP and a source (first terminal) of the switching transistor T1.

The reference cell 21 includes a switching transistor T2 (also referred to as a reference switching element) having a gate controlled by the reference wordline WLref and a drain (second terminal) connected to the complementary bitline BLB, and a reference capacitor C2 connected between a reference plate voltage (or reference plate electrode) VPref and a source (first terminal) of the switching transistor T2.

In operation, in a first phase (PHASE0), the bitline BL and the complementary bitline BLB are precharged to a level of a power supply voltage Vdd. In a second phase (PHASE1), a charge sharing operation occurs in the bitline BL, and a capacitive coupling operation occurs in the complementary bitline BLB. In a third phase (PHASE2), data is sensed.

More particularly, when the selected wordline WL is enabled and the data stored in the main cell 20 is data "0", charges corresponding to Δ1 are shared between the voltage of "0V" stored in the main capacitor C1 and the voltage of 'Vdd' precharged in the bitline capacitor CB.

When selected wordline WL is enabled and the data stored in the main cell 20 is data '1', Δ1 corresponds to 0V because the voltage of 'Vdd' stored in the main capacitor C1 is same as the voltage of 'Vdd' precharged in the bitline capacitor CB.

In the reference cell 21, the reference plate voltage VPref of the reference cell 21 transitions from a first voltage V1 such as Vdd to a second voltage V2 such as Vdd/2, lower than the first voltage V1. Therefore, the voltage of the complementary bitline BLB corresponds to Δ2 through the capacitive coupling.

When the second voltage V2 is lower than the power supply voltage Vdd and higher than a ground voltage Vss, Δ1 is greater than Δ2. When the second voltage V2 is equal to a half of the power supply voltage Vdd, Δ2 is equal to a half of Δ1. In such a scheme, the reference voltage for sensing data "1" or data "0" may be more easily generated.

Figure 3:
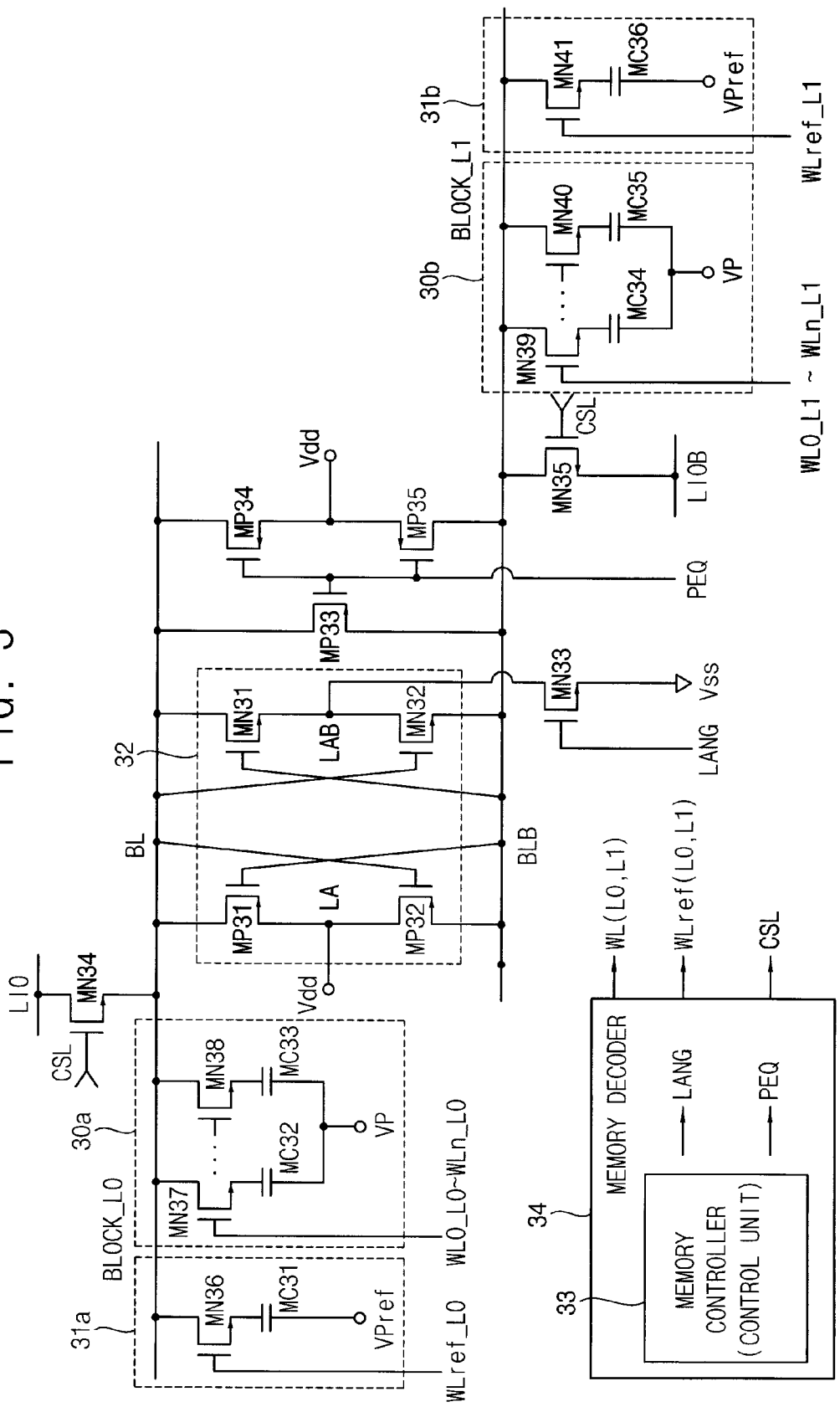
FIG. 3 is a circuit diagram illustrating an example of a DRAM which employs the embodiment of FIG. 2 according to some example embodiments.

FIG. 3 is a circuit diagram illustrating an example of a DRAM which employs the embodiment of FIG. 2 according to some example embodiments.

Referring to FIG. 3, a bitline sense amplifier such as the bitline sense amplifier 22 in FIG. 2 includes a latch circuit 32 including p-type metal-oxide semiconductor (PMOS) transistors MP31 and MP32 and n-type metal-oxide semiconductor (NMOS) transistors MN31 and MN32.

Drains of the PMOS transistor MP31 and the NMOS transistor MN31 are commonly connected to the bitline BL, and the drains of the PMOS transistor MP32 and the NMOS transistor MN32 are commonly connected to the complementary bitline BLB. A voltage in the bitline BL and a voltage in the complementary bitline BLB are complementary to each other.

Sources of the PMOS transistors MP31 and MP32 are commonly connected to a bias node LA, and sources of the NMOS transistors MN31 and MN32 are connected to a bias node LAB. Gates of the PMOS transistor MP31 and the NMOS transistor MN31 are commonly connected to the complementary bitline BLB, and gates of the PMOS transistor MP32 and the NMOS transistor MN32 are commonly connected to the bitline BL. High voltage bias source represented as the power supply voltage Vdd is applied to the sources of the PMOS transistors MP31 and MP32 through the bias node LA.

Biasing NMOS transistor MN33 is connected between the bias node LAB and a lower bias voltage such as the ground voltage Vss.

Sources of the NMOS transistors MN31 and MN32 are connected to a drain of the biasing NMOS transistor MN33 at the bias node LAB. The biasing NMOS transistor MN33 has a source connected to the lower bias voltage source such as the ground voltage Vss and a gate controlled by a bias control signal LANG.

PMOS transistor MP33 is connected between the bitline BL and the complementary bitline BLB, the PMOS transistor MP33 has a gate controlled by an equalizing control signal PEQ to equalize the bitline BL and the complementary bitline BLB. PMOS transistors MP34 and MP35 are connected in series between the bitline BL and the complementary bitline BLB, and sources of the PMOS transistors MP34 and MP35 are connected to a high voltage bias source such as the power supply voltage Vdd. Gates of the PMOS transistors MP34 and MP35 are commonly connected to a gate of the PMOS transistor MP33 and are controlled by the equalizing control signal PEQ.

In FIG. 3, a memory cell block BLOCK_L0 and a memory cell block BLOCK_L1 are taken for example, and the memory cell block BLOCK_L0 is connected to the bitline BL and the memory cell block BLOCK_L1 is connected to the complementary bitline BLB.

The memory cell block BLOCK_L0 includes a main cell 30a and a reference cell 31a. The main cell 30a includes a plurality of memory cells, one of the memory cell includes a switching transistor MN37 and a capacitor MC32 which are serially connected between the bitline BL and a main plate voltage source VP, and another of the memory cells includes a switching transistor MN38 and a capacitor MC33 which are serially connected between the bitline BL and the main plate voltage source VP. In addition, gates of the switching transistors MN37 and MN38 are controlled by a wordline WL0_L0 and WLn_L0, respectively. The reference cell 31a includes a switching transistor MN36 and a capacitor MC31 which are serially connected between the bitline BL and a reference plate voltage source Vpref_L0. In addition, a gate of the switching transistor MN36 is controlled by a wordline WLref_L0. That is, the plate voltage sources of the reference cell 31a and the main cell 30a are separated from each other.

The memory cell block BLOCK_L1 includes a main cell 30b and a reference cell 31b. The main cell 30b includes a plurality of memory cells, one of the memory cell includes a switching transistor MN39 and a capacitor MC34 which are serially connected between the complementary bitline BLB and the main plate voltage source VP, and another of the memory cells includes a switching transistor MN40 and a capacitor MC35 which are serially connected between the complementary bitline BLB and the main plate voltage source VP. In one embodiment, the main plate voltage source VP of the memory cell block BLOCK_L0 and BLOCK_L1 are different sources such as VP_L0 and VP_L1. In addition, gates of the switching transistors MN39 and MN40 are controlled by a wordline WL0_L1 and WLn_L1, respectively. The reference cell 31b includes a switching transistor MN41 and a capacitor MC36 which are serially connected between the complementary bitline BLB and the reference plate voltage source VPref_L1. In addition, a gate of the switching transistor MN41 is controlled by a wordline WLref_L1. That is, the plate voltage sources of the reference cell 31b and the main cell 30b are separated from each other.

A column selection transistor MN34 is connected between the bitline BL and a local input/output (I/O) LIO, and a gate of the column selection transistor MN34 is controlled by a column selection line CSL. A column selection transistor MN35 is connected between the complementary bitline BLB and a complementary local I/O LIOB, and a gate of the column selection transistor MN35 is controlled by the column selection line CSL.

The column selection transistors MN34 and MN35 are turned on/off in response to the column selection line CSL. When the main memory cells 30a and 30b are selected and accessed by a memory decoder 34, the column selection line CSL has a logic high level and the bitline BL is connected to the local I/O LIO and the complementary bitline BLB is connected to the complementary local I/O LIOB.

For example, the memory decoder 34 decodes addresses to generate the column selection line CSL signal for selecting the memory cells 30a and 30b, wordline WL0_L0~WLn_L0/ complementary wordline WL0_L~WLn_L1 signals and reference wordline WLref_L0/complementary reference wordline WLref_L1 signals.

In addition, the memory decoder 34 may include a memory controller (or control unit) 33. The memory controller 33 may be a part of the memory decoder 34, and the memory controller 33 may generate the bias control signal LANG and the equalizing control signal PEQ.

Figure 4:
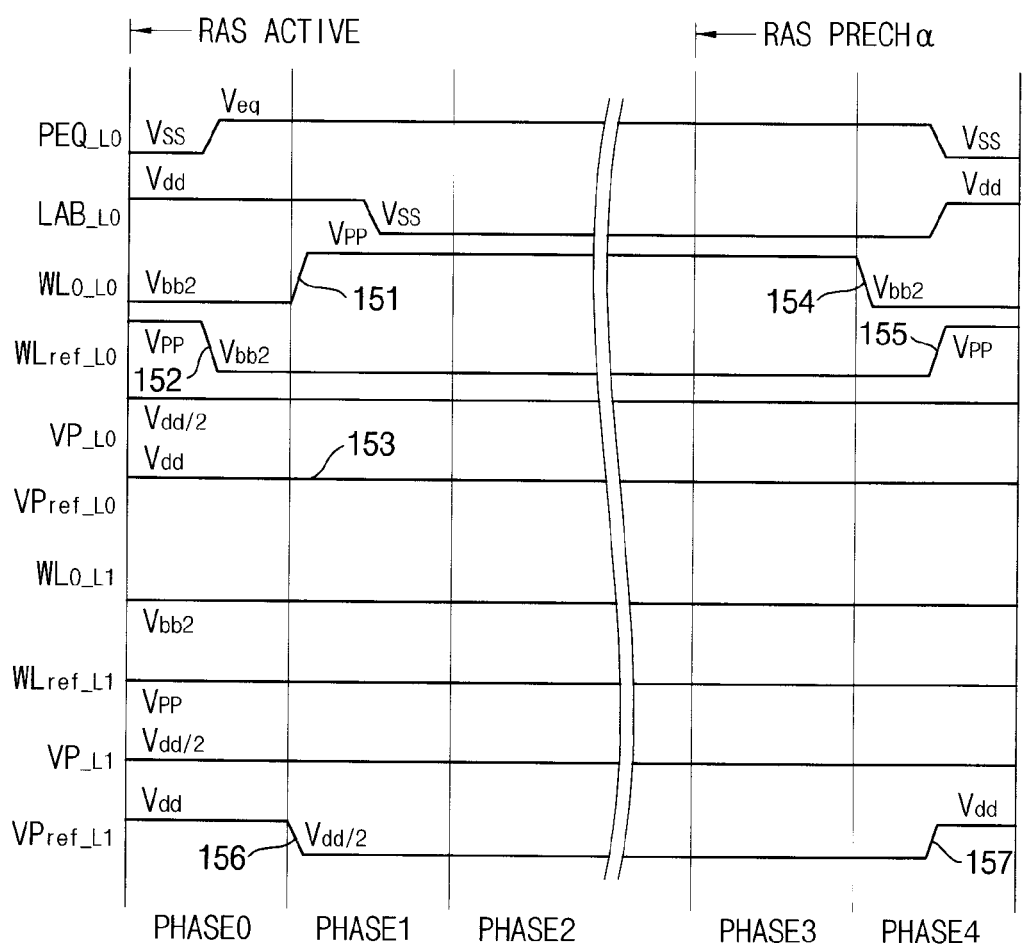
FIG. 4 is a timing diagram illustrating operation of the DRAM of FIG. 3 according to example embodiments.

FIG. 4 is a timing diagram illustrating operation of the DRAM of FIG. 3 according to example embodiments.

Hereinafter, data sensing in the DRAM will be described with reference to FIGS. 3 and 4.

The bitline BL is precharged to a level of the power supply voltage Vdd corresponding to a voltage level of data '1'. The power supply voltage Vdd can be applied from outside DRAM or generated in DRAM. In addition, the level of the plate voltage VP of the main cells 30a and 30b is maintained at half of the power supply voltage Vdd, that is, Vdd/2 for minimizing difference of field effect of two terminals of the main cell capacitors MC32, MC33, MC34 and MC35.

Firstly, there will be description on operation of an unselected memory block, such as in a standby mode.

A level of the wordline WL0_L1 of a main cell is maintained at a lower voltage Vbb2 level, a level of the wordline WLref_L1 of a reference cell is maintained at a higher voltage Vpp level, and level of the plate voltage VPref_L1 is maintained at the power supply voltage Vdd level. The power supply voltage Vdd level is applied to a first terminal (which is connected to the switching transistor) of a reference cell capacitor through the switching transistor which is turned on, and the level of the plate voltage VPref_L1 is maintained at the power supply voltage Vdd level. Therefore, voltage difference of the reference cell capacitor is maintained at '0' volt. Accordingly, the example embodiment of FIG. 3 is more reliable in view of difference of field effect compared with a general cell capacitor.

The higher voltage Vpp may have a level equal to or higher than the power supply voltage Vdd. The lower voltage Vbb may have a level equal to or lower than the ground voltage Vss.

Second, there will be description on operation of a selected memory block, for example, the memory block BLOCK_L0 in FIG. 3.

In an active mode (denoted by 'RAS ACTIVE') during phases PHASE0, PHASE1 and PHASE2, level of a wordline WL0_L0 of the main cell, on which write operation or read operation will be performed, transitions from a lower voltage Vbb2 level to a higher voltage Vpp level as represented by a reference numeral 151, and thus, a corresponding switching transistor of the main cell (for example, switching transistor MN37) is turned on. The level of a reference wordline WLref_L0 of the reference cell transitions from the higher voltage Vpp level to the lower voltage Vbb2 level as represented by a reference numeral 152, and thus, a corresponding switching transistor of the reference cell (for example, switching transistor MN36) is turned off. Therefore, electrical charges charged in a reference cell capacitor are separated from a bitline capacitance. A level of the plate voltage VPref_L0 of the reference cell is maintained at the power supply voltage Vdd level as represented by a reference numeral 153, and thus voltage difference of the reference cell capacitor is maintained at '0' volt.

In a precharge mode (denoted by 'RAS PRECH') during phases PHASE3 and PHASE4, the main cell of selected memory block BLOCK_L0 is disabled when the level of the wordline WL0_L0 of the main cell transitions from the higher voltage Vpp level to the lower voltage Vbb2 level as represented by a reference numeral 154. In addition, the level of the reference wordline WLref_L0 of the reference cell transitions from the lower voltage Vbb2 level to the higher voltage Vpp level as represented by a reference numeral 155, and thus the reference cell is enabled. During the precharge mode, the sensing operation is not enabled for preventing the voltage difference corresponding to the power supply voltage Vdd level from being applied to the two terminals of the reference cell capacitor. That is, the sensing operation may be enabled after a bitline equalizing operation is performed.

There will be more description below on operation of the unselected memory block BLOCK_L1.

Since the level of the wordline WL0_L1 of the main cell of block BLOCK_L1 is maintained at a lower voltage Vbb2 level, the main cell 30b is maintained at a disabled state. Since the level of the wordline WLref_L1 of the reference cell is maintained at a higher voltage Vpp level, the reference cell 31b is maintained at an enabled state. When the level of the wordline WL0_L0 transitions from the lower voltage Vbb2 level to the higher voltage Vpp level as represented by the reference numeral 151, the level of the plate voltage VPref_L1 of the reference cell transitions from the power supply voltage Vdd level to an intermediate level such as half of the power supply voltage Vdd level between the power supply voltage level and the ground voltage level Vss as illustrated by a reference numeral 156. At this time, the above-mentioned capacitive coupling occurs between the cell capacitance CS and the bitline capacitance CB. In the precharge mode, the level of the plate voltage VPref_L1 of the reference cell transitions from the intermediate level Vdd/2 to the power supply voltage Vdd level as represented by the reference numeral 157.

Figure 5:
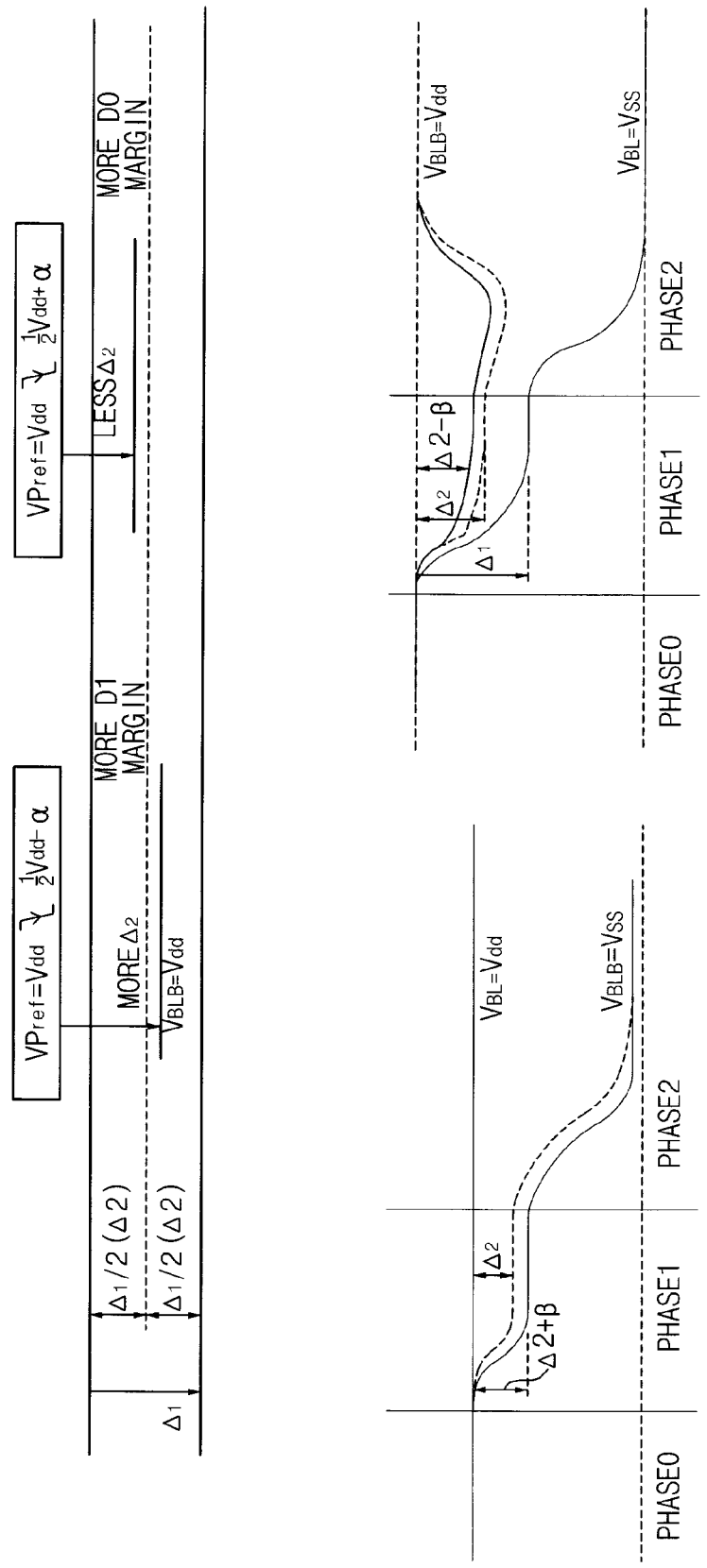
FIG. 5 is a timing diagram for illustrating merits of certain example embodiments.

FIG. 5 is a timing diagram for illustrating merits of certain example embodiments.

First, when a DRAM device employs the configuration of FIG. 2 or FIG. 3, the DRAM device may operate with a power supply voltage whose level is equal to or lower than 1 volt. When a voltage level of a bitline node (terminal connected to the switching transistor) of the cell transistor decreases, gate induced drain leakage (GIDL) and interference decrease, and thus refresh characteristic of the DRAM may be enhanced. Since data sensing speed increases due to increase of the voltage level at a common mode of the bitline sense amplifier, a size of the NMOS amplifier of the bitline sense amplifier may be reduced. In addition, a size of the PMOS amplifier of the bitline sense amplifier may be reduced because the PMOS amplifier mainly contributes to data restoring. In addition, disturbance of the bitline (or the complementary bitline) precharged at the ground voltage may be reduced due to data line charges in column operation.

Second, the DRAM device employing the configuration of FIG. 2 or FIG. 3 may adjust a data sensing margin by adjusting the reference plate voltage VPref. Referring to FIG. 5, when the sensing margin for data "1" needs to be improved more than the sensing margin for data "0" (e.g., more errors are occurring for data "1", such that an increase in sensing margin for data "1" will improve errors more than an increase in sensing margin for data "0"), a corresponding Vpref is changed to a particular voltage level below a half of the power supply voltage Vdd, (e.g., ½ vdd−α). Alternatively, when the sensing margin for data "0" needs to be improved more than the sensing margin for data "1", a corresponding Vpref is changed to a particular voltage level above a half of the power supply voltage Vdd, (e.g., ½ vdd+α).

Figure 6:
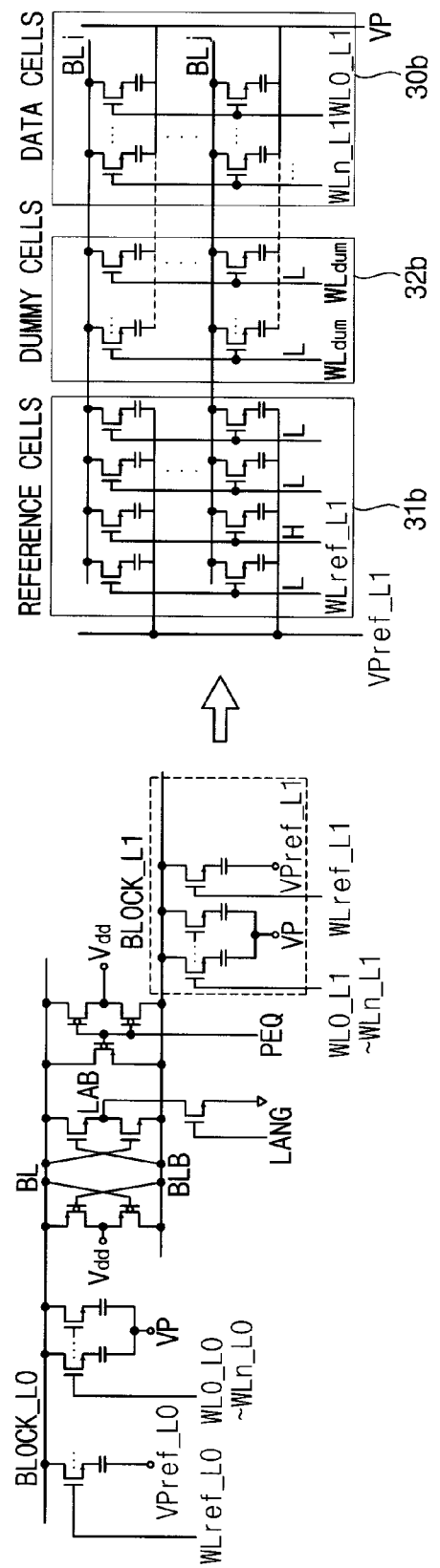
FIG. 6 is a circuit diagram illustrating an example of an arrangement of the reference cell in FIG. 3 according to some example embodiments.

FIG. 6 is a circuit diagram illustrating an example of an arrangement of the reference cell in FIG. 3 according to some example embodiments.

Referring to FIG. 6, a plurality of dummy cells 32b are arranged between the reference cells 31b and the main cells (represented by 'data cells') 30b for separating the plate electrode VP of the main cells 30b and the plate electrode VPref of the reference cells 31b. The dummy cells 32b include a plurality of switching transistors controlled by dummy wordlines WLdum and corresponding capacitors. As illustrated by dotted lines in the dummy cells 32b and the main cells 30b, the plate electrode VP of the main cells 30b and the plate electrode VPref of the reference cells 31b may be separated selectively by removing polysilicons corresponding to the dummy cells 32b in a process of forming gate electrode patterns after depositing polysilicons for plate electrodes. In FIG. 6, wordlines WL0~WLn in the cells 30b may correspond, for example, to the wordline WL0_L1~WLn_L1 in the main cells 30b in FIG. 3.

The reference cells 31b may be arranged at edge or center of a cell array with respect to the bitline sense amplifier. The reference cells 31b may include a plurality of reference cells, and when one or more of the plurality of reference cells fail, then the plurality of remaining reference cells passing the test may be selectively designated through laser fusing or MRS (mode register set).

Figure 7A:
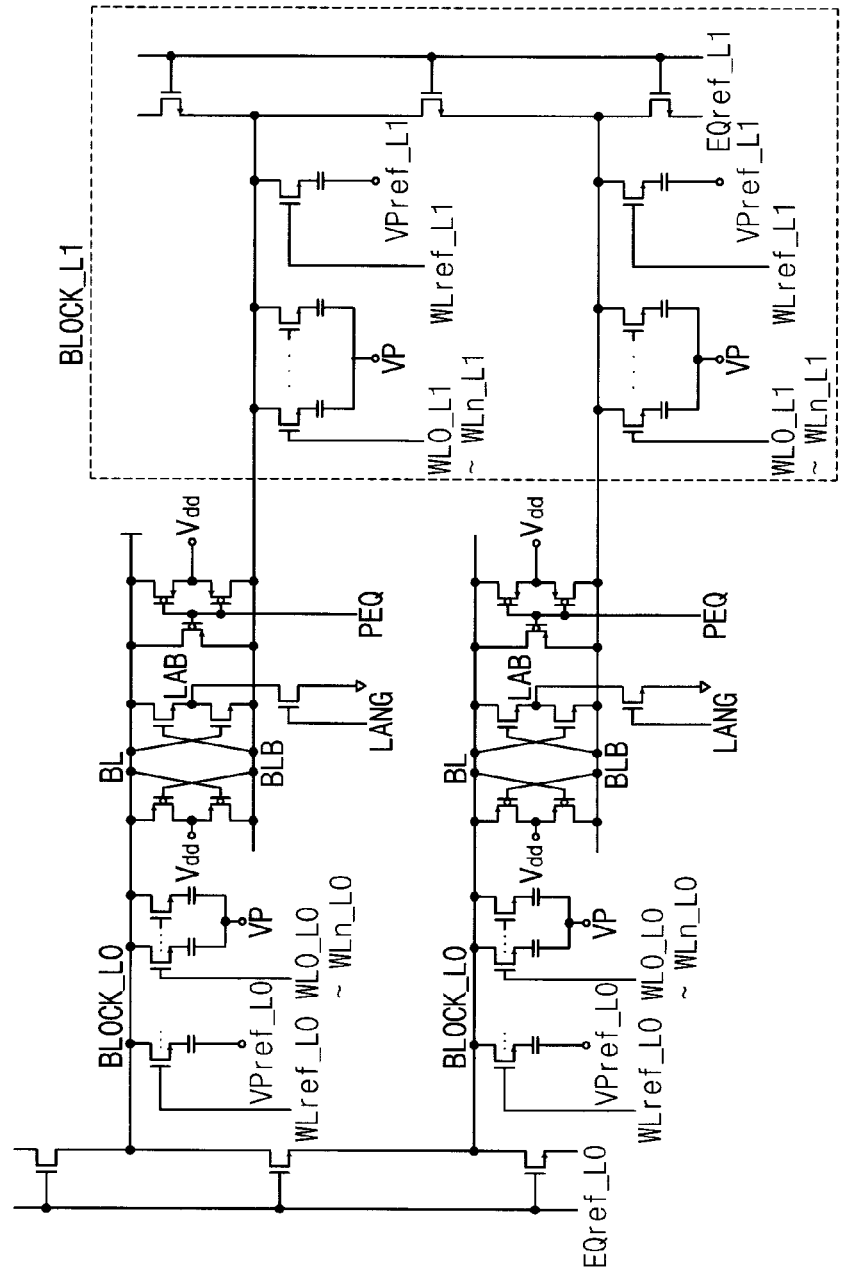
FIG. 7A is a circuit diagram illustrating another example of an arrangement of the reference cell in FIG. 3 according to some example embodiments.

FIG. 7A is a circuit diagram illustrating another example of an arrangement of the reference cell in FIG. 3 according to some example embodiments.

Figure 7B:
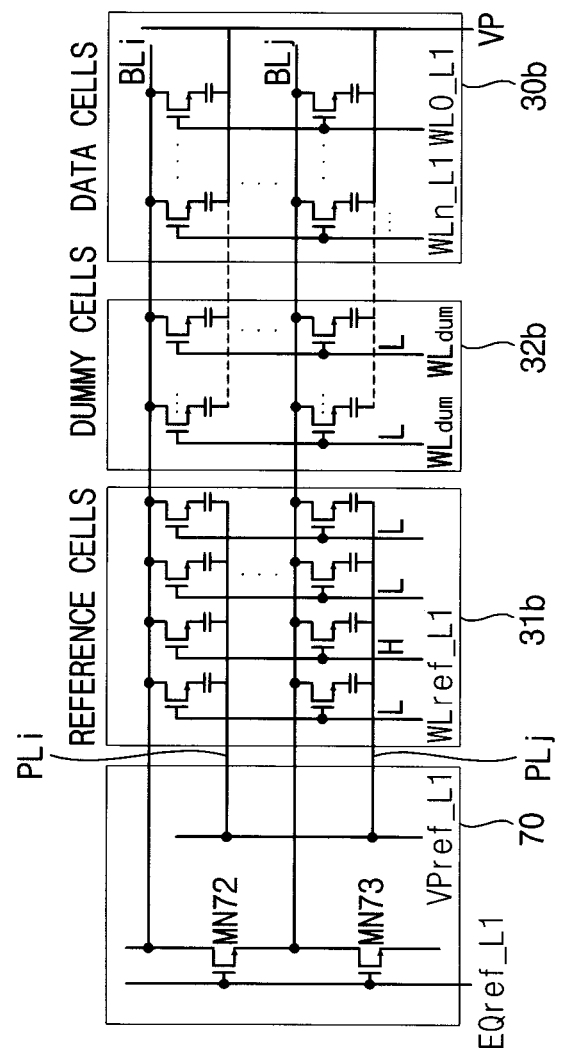
FIG. 7B is a circuit diagram illustrating the memory block FIG. 7A according to some example embodiments.

FIG. 7B is a circuit diagram illustrating the memory block BLOCK_L1 in FIG. 7A according to some example embodiments.

Referring to FIGS. 7A and 7B, the reference cells 31b include a plurality of unit cells for enhancing distribution characteristic of the cell capacitor. The plurality of unit cells may be divided into a plurality of groups. Unit cells in a same group are connected to corresponding one of bitlines BLi and BLj. In addition, capacitors connected to each of the unit cells in the same group are connected to corresponding one of plate lines PLi and PLj to which corresponding plate voltages are applied. Voltages of the bitlines may be averaged by an averaging circuit 70. In FIG. 7B, wordlines WL0_L1~WLn_L1 in the main cell 30b may correspond to the wordline WL0_L1~WLn_L1 in FIG. 7A.

In case of the capacitive coupling using the reference cell plate electrode, a reference voltage level due to distribution of the cell capacitors may be averaged by electrically connecting the adjacent M (M is natural number) bitlines BLi and BLj using transistors MN72 and MN73 in the averaging circuit 70. The transistors MN72 and MN73 are controlled to be turned on/off in response to an averaging control signal EQref.

For example, when the reference cells are not used, each capacitor of the main cell is not associated with other capacitors of any reference cells. However, when the reference cells are used, two capacitors (one of the main cell and the other of the reference cell) are associated. Therefore, the distribution of the cell capacitors may increase by $\sqrt{2}=1.414$ compared with a case when voltage of the bitlines are not averaged. When the unit cells in the same group are connected to corresponding one of four plate lines, the distribution of the cell capacitors may increase by $\sqrt{5}/2=1.118$. That is, the distribution characteristic of the cell capacitor may be enhanced.

Figure 8:
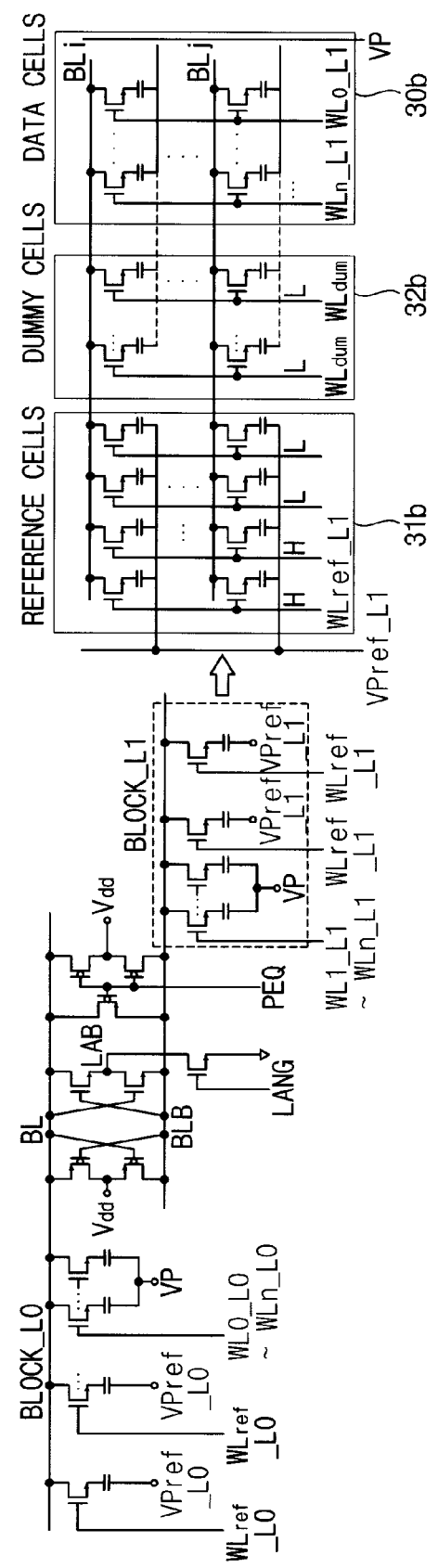
FIG. 8 is a circuit diagram illustrating another example of an arrangement of the reference cell in FIG. 3 according to some example embodiments.

FIG. 8 is a circuit diagram illustrating another example of an arrangement of the reference cell in FIG. 3 according to some example embodiments.

Referring to FIG. 8, the reference cell 31b includes a plurality of unit cells whose reference wordlines are simultaneously enabled for enhancing distribution characteristic of the cell capacitor. When some of the reference wordlines connected to the unit cells are simultaneously enabled (represented 'H'), the level of a reference voltage may be averaged. In FIG. 8, wordlines WL0~WLn in the main cell 30b may correspond to the wordline WL0_L1~WLn_L1 in the main cell 30b in FIG. 3.

In case when a number of the reference wordlines WLref that are simultaneously enabled more and more increase, there is need for increasing a second voltage V2 to a higher level than when a single reference wordline is used when transitioning the level of the reference plate voltage VPref from a first voltage V1 (for example, V1=Vdd) to the second voltage V2 (for example, V2=Vdd/2).

In the above-mentioned example embodiments, it is described that the bitline is precharged to the power supply voltage Vdd level. Hereinafter, there will be description on the bitline being precahrged to the ground voltage Vss level.

Figure 9:
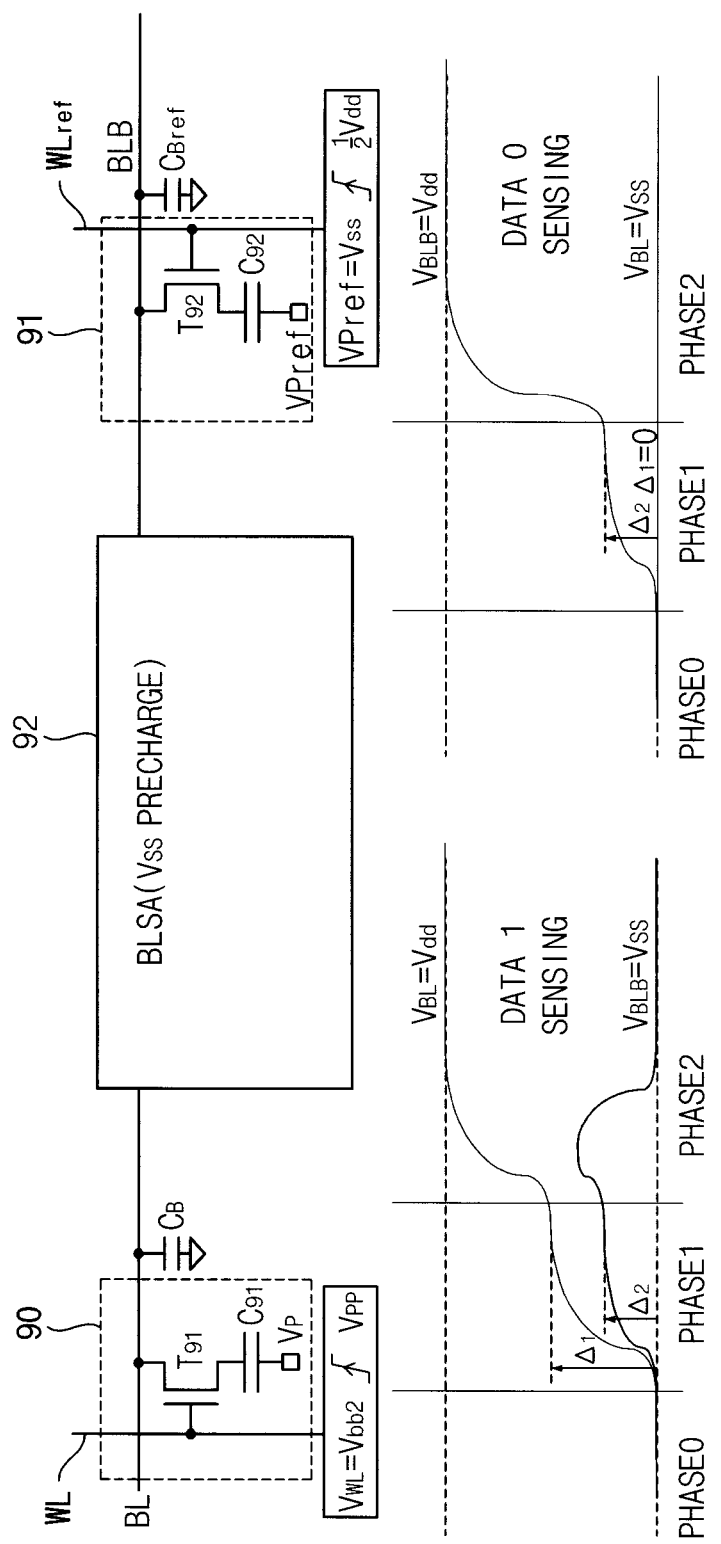
FIG. 9 illustrates data sensing operation in the semiconductor memory device according to some example embodiments.

FIG. 9 illustrates data sensing operation in the semiconductor memory device according to some example embodiments.

Referring to FIG. 9, a main cell (a memory cell) 90 is arranged at an area intersected by a wordline WL and a bitline BL, and a reference cell (a reference memory cell) 91 is arranged at an area intersected by a reference wordline WLref and a complementary bitline BLB. A bitline sense amplifier (BLSA) 92 is connected between the bitline BL and the complementary bitline BLB, and senses and amplifies data '0' or data '1' transferred through the bitline BL and the complementary bitline BLB.

Although one main cell 90 is connected to the bitline BL and one reference cell is connected to the complementary bitline BLB in FIG. 9, a plurality of reference cells and additional main cells may be further connected to the bitline BL, and a plurality of main cells and additional reference cells may be further connected to the complementary bitline BLB.

The main cell 90 includes a switching transistor (or switching element) T91 having a gate controlled by the wordline WL and a drain (second terminal) connected to the bitline BL, and a main capacitor C91 connected between a main plate voltage (or main plate electrode) VP and a source (first terminal) of the switching transistor T91.

The reference cell 91 includes a switching transistor T92 having a gate controlled by the reference wordline WLref and a drain (second terminal) connected to the complementary bitline BLB, and a reference capacitor C92 connected between a reference plate voltage (or reference plate electrode) VPref and a source (first terminal) of the switching transistor T92.

In a first phase (PHASE0), the bitline BL and the complementary bitline BLB are precharged to a level of the ground voltage Vss. In a second phase (PHASE1), the charge sharing operation occurs in the bitline BL, and the capacitive coupling operation occurs in the complementary bitline BLB. In a third phase (PHASE2), data is sensed.

More particularly, when the selected wordline WL is enabled and the data stored in the main cell 90 is data '1', charges corresponding to Δ1 are shared between the voltage of '1V' stored in the main capacitor C91 and the voltage of Vss precharged in the bitline capacitor CB.

When selected wordline WL is enabled and the data stored in the main cell 90 is data '0', Δ1 corresponds to 0V because the voltage of 'Vss' stored in the main capacitor C91 is same as the voltage of 'Vss' precharged in the bitline capacitor CB.

The reference cell 91 changes the reference plate voltage VPref from a first voltage V1 such as Vss to a second voltage V2 such as Vdd/2 higher than the first voltage V1. Therefore, the voltage of the complementary bitline BLB corresponds to Δ2 through the capacitive coupling.

When the second voltage V2 is lower than the power supply voltage Vdd and higher than a ground voltage Vss, Δ1 is greater than Δ2. When the second voltage V2 is equal to a half of the power supply voltage Vdd, Δ2 is equal to a half of Δ1. Therefore, the reference voltage for sensing data '1' or data '0' may be more easily generated.

Figure 10:
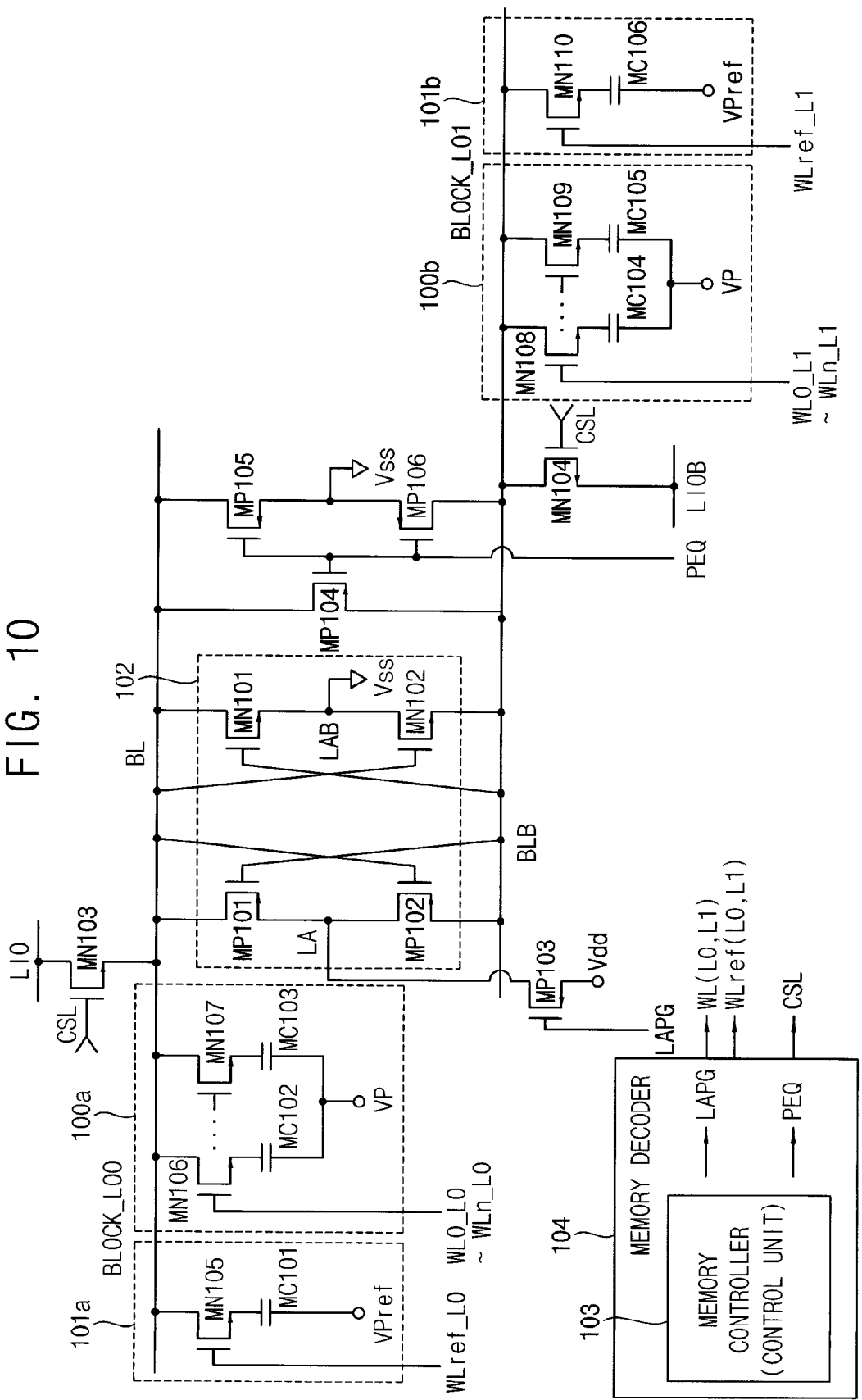
FIG. 10 is a circuit diagram illustrating an example of a DRAM which employs the concept of FIG. 9 according to some example embodiments.

FIG. 10 is a circuit diagram illustrating an example of a DRAM which employs the concept of FIG. 9 according to some example embodiments.

Referring to FIG. 10, a bitline sense amplifier such as the bitline sense amplifier 92 in FIG. 9 includes a latch circuit 102 including PMOS transistors MP101 and MP102 and NMOS transistors MN101 and MN102.

Drains of the PMOS transistor MP101 and the NMOS transistor MN101 are commonly connected to the bitline BL, and the drains of the PMOS transistor MP102 and the NMOS transistor MN102 are commonly connected to the complementary bitline BLB. A voltage in the bitline BL and a voltage in the complementary bitline BLB are complementary to each other.

Sources of the PMOS transistors MP101 and MP102 are commonly connected to a bias node LA, and sources of the NMOS transistors MN101 and MN102 are connected to a bias node LAB. Gates of the PMOS transistor MP101 and the NMOS transistor MN101 are commonly connected to the complementary bitline BLB, and gates of the PMOS transistor MP102 and the NMOS transistor MN102 are commonly connected to the bitline BL. Low voltage bias source represented as the ground voltage Vss is applied to the sources of the NMOS transistors MN101 and MP102 through the bias node LAB.

Biasing PMOS transistor MP103 is connected between the bias node LA and a high bias voltage such as the power supply voltage Vdd.

Sources of the PMOS transistors MP101 and MP102 are connected to a drain of the biasing PMOS transistor MP103 at the bias node LA. The biasing PMOS transistor MP103 has a source connected to the higher bias voltage source such as the power supply voltage Vdd and a gate controlled by a bias control signal LAPG.

PMOS transistor MP104 is connected between the bitline BL and the complementary bitline BLB, the PMOS transistor MP104 has a gate controlled by an equalizing control signal PEQ to equalize the bitline BL and the complementary bitline BLB. PMOS transistors MP105 and MP106 are connected in series between the bitline BL and the complementary bitline BLB, and sources of the PMOS transistors MP105 and MP106 are connected to a high voltage bias source such as the power supply voltage Vdd. Gates of the PMOS transistors MP105 and MP106 are commonly connected to a gate of the PMOS transistor MP104 and are controlled by the equalizing control signal PEQ.

In FIG. 10, a memory cell block BLOCK_L00 and a memory cell block BLOCK_L01 are taken for example, and the memory cell block BLOCK_L00 is connected to the bitline BL and the memory cell block BLOCK_L01 is connected to the complementary bitline BLB.

The memory cell block BLOCK_L00 includes main cells 100a and a reference cell 101a. The main cells 100a include a plurality of memory cells, one of the memory cells includes a switching transistor MN106 and a capacitor MC102 which are serially connected between the bitline BL and a main plate voltage source VP, and another of the memory cells includes a switching transistor MN107 and a capacitor MC103 which are serially connected between the bitline BL and the main plate voltage source VP. In addition, gates of the switching transistors MN106 and MN107 are controlled by a wordline WL0_L0 and WLn_L0, respectively. The reference cell 101a includes a switching transistor MN105 and a capacitor MC101 which are serially connected between the bitline BL and a reference plate voltage source VPref. In addition, gate of the switching transistor MN 105 is controlled by a reference wordline WLref_L0. That is, the plate voltage sources of the reference cell 101a and the main cells 100a are separated with respect to each other.

The memory cell block BLOCK_L01 includes main cells 100b and a reference cell 101b. The main cells 100b include a plurality of memory cells, one of the memory cell includes a switching transistor MN108 and a capacitor MC104 which are serially connected between the complementary bitline BLB and the main plate voltage source VP, and another of the memory cells includes a switching transistor MN109 and a capacitor MC105 which are serially connected between the complementary bitline BLB and the main plate voltage source VP. In addition, gates of the switching transistors MN108 and MN109 are controlled by a wordline WL0_L1 and WLn_L1, respectively. The reference cell 101b includes a switching transistor MN110 and a capacitor MC106 which are serially connected between the complementary bitline BLB and the reference plate voltage source Vpref_L1. In addition, gate of the switching transistor MN110 is controlled by a complementary reference wordline WLref_L1. That is, the plate voltage sources of the reference cell 101b and the main cells 100b are separated with respect to each other.

The column selection transistors MN103 and MN104 are turned on/off in response to the column selection line CSL. When the main memory cells 100a and 100b are selected and accessed by a memory decoder 104, the column selection line CSL has a logic high level and the bitline BL is connected to the local I/O LIO and the complementary bitline BLB is connected to the complementary local I/O LIOB.

For example, the memory decoder 104 decodes addresses to generate the column selection line CSL signal for selecting the memory cells 100a and 100b, wordlines WL0_L0~WLn_L0/complementary wordlines WL0_L1~WLn_L1 signals and reference wordline WLref_L0/complementary reference wordline WLref_L1 signals.

In addition, the memory decoder 104 may include a memory controller (or control unit) 103. The memory controller 103 may be a part of the memory decoder 104, and the memory controller may generate the bias control signal LAPG and the equalizing control signal PEQ.

Figure 11:
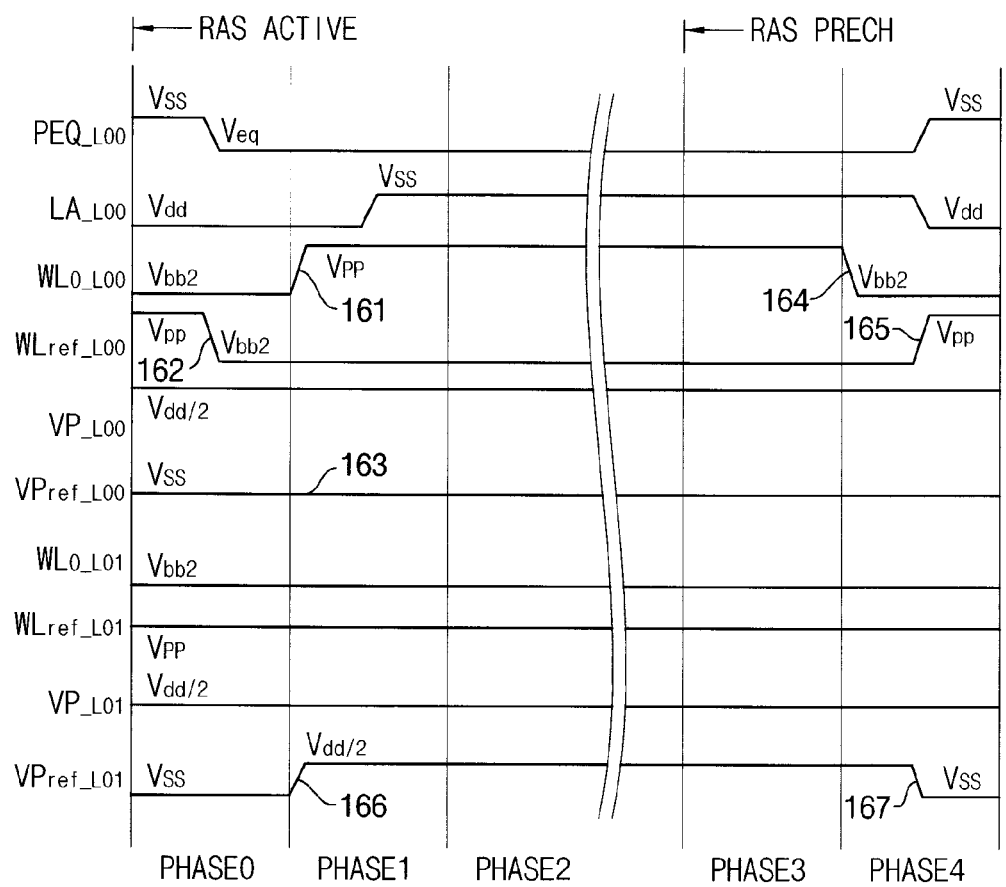
FIG. 11 is a timing diagram illustrating operation of the DRAM of FIG. 10 according to example embodiments.

FIG. 11 is a timing diagram illustrating operation of the DRAM of FIG. 10 according to example embodiments.

Hereinafter, data sensing in the DRAM will be described with reference to FIGS. 10 and 11.

The bitline BL is precharged to a level of the ground voltage Vss corresponding to a voltage level of data '0'. In addition, the level of the plate voltage VP of the main cells 100a and 100b is maintained at half of the power supply voltage Vdd, that is, Vdd/2 for minimizing difference of field effect of two terminals of the main cell capacitors MC 102, MC 103, MC 104 and MC105.

First, there will be a description on operation of an unselected memory block.

A level of the wordline WL0_L01 of a main cell is maintained at a lower voltage Vbb2 level, a level of the wordline WLref_L01 of a reference cell is maintained at a higher voltage Vpp level, and a level of the plate voltage VPref_L01 of the reference cell is maintained at the ground voltage Vss level. The ground voltage Vss level is applied to a first terminal (which is connected to the switching transistor) of a reference cell capacitor through the switching transistor which is turned on, and the level of the plate voltage VPref_L01 is maintained at the ground voltage Vss level. Therefore, a voltage difference of the reference cell capacitor is maintained at '0' volt. Accordingly, the example embodiment of FIG. 10 is more reliable in view of differences of field effect compared with a general cell capacitor.

The higher voltage Vpp may have a level equal to or higher than the power supply voltage Vdd. The lower voltage Vbb may have a level equal to or lower than the ground voltage Vss.

Second, there will be a description on operation of a selected memory block, for example, the memory block BLOCK_L00 in FIG. 10.

In an active mode (denoted by 'RAS ACTIVE') during phases PHASE0, PHASE1 and PHASE2, level of a wordline WL0_L00 of the main cell, on which write operation or read operation will be performed, transitions from a lower voltage Vbb2 level to a higher voltage Vpp level as represented by a reference numeral 161, and thus, a corresponding switching transistor of the main cell (for example, switching transistor MN106) is turned on. A level of a reference wordline WLref_L00 of the reference cell transitions from the higher voltage Vpp level to the lower voltage Vbb2 level as represented by a reference numeral 162, and thus, a corresponding switching transistor of the reference cell (for example, switching transistor MN10) is turned off. Therefore, electrical charges charged in a reference cell capacitor are separated from a bitline capacitance. A level of the plate voltage VPref_L00 of the reference cell is maintained at the ground voltage Vss level as represented by a reference numeral 163, and thus voltage difference of the reference cell capacitor is maintained at '0' volts.

In a precharge mode (denoted by 'RAS PRECH') during phases PHASE3 and PHASE4, the main cell is disabled, and the level of the wordline WL0_L00 of the main cell transitions from the higher voltage Vpp level to the lower voltage Vbb2 level as represented by a reference numeral 164. In addition, the level of the reference wordline WLref_L00 of the reference cell transitions from the lower voltage Vbb2 level to the higher voltage Vpp level as represented by a reference numeral 165, and thus the reference cell is enabled. During the precharge mode, a sensing operation is not enabled for preventing the voltage difference corresponding to the ground voltage Vss level from being applied to the two terminals of the reference cell capacitor. That is, the sensing operation may be enabled after bitline equalizing operation is performed.

There will be more description on operation of the unselected memory block.

Since the level of level of the wordline WL0_L01 of the main cell is maintained at a lower voltage Vbb2 level, the main cell 100b is maintained at a disabled state. Since the level of the wordline WLref_L01 of the reference cell is maintained at a higher voltage Vpp level, the reference cell 101b is maintained at an enabled state. When the level of the wordline WL0_L00 transitions from the lower voltage Vbb2 level to the higher voltage Vpp level as represented by the reference numeral 161, the level of the plate voltage VPref_L01 of the reference cell transitions from the ground voltage VSS level to an intermediate level such as half of the power supply voltage Vdd level between the power supply voltage level and the ground voltage level Vss as illustrated by a reference numeral 166. At this time, the above-mentioned capacitive coupling occurs between the cell capacitance CS and the bitline capacitance CB.

FIGS. 12A to 12D are timing diagrams illustrating that the bitline and the complementary bitline are precharged to the power supply voltage level or the ground voltage level when data '0' or data '1' is sensed.

Figure 12A:
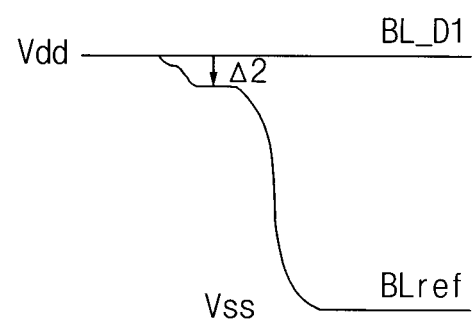
FIGS. 12A to 12D are timing diagrams illustrating that the bitline and the complementary bitline are precharged to the power supply voltage level or the ground voltage level when data '0' or data '1' is sensed, according to certain embodiments.
Figure 12B:
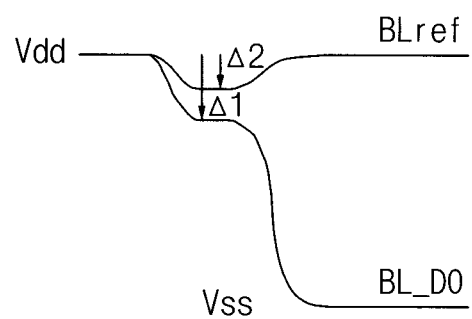

FIGS. 12A and 12B illustrate that the bitline and the complementary bitline are precharged to the power supply voltage Vdd level when data '1' and data '0' are respectively sensed.

Referring to FIGS. 12A and 12B, a voltage level of a reference bitline BLref is changed by Δ2 due to the capacitive coupling when the level of the plate voltage VPref of the reference cell is changed. Therefore, data '1' BL_D1 may be sensed through the reference bitline BLref whose voltage level is changed by Δ2 as illustrated in FIG. 12A. In addition, data '0' BL_D0 may be sensed through the bitline whose voltage level is changed by Δ1 due to the charge sharing between the bitline and the cell capacitor as illustrated in FIG. 12B.

Figure 12C:
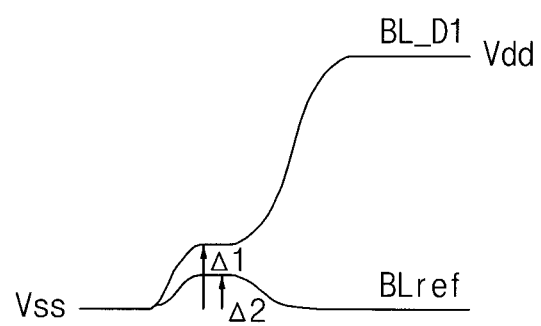
Figure 12D:
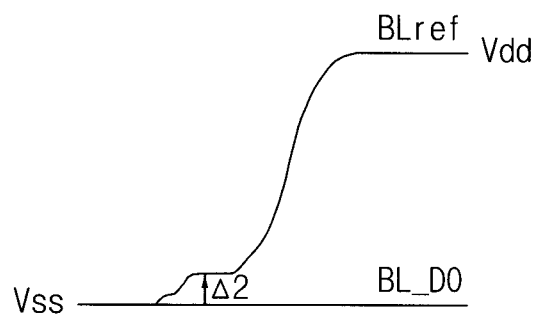

FIGS. 12C and 12D illustrate that the bitline and the complementary bitline are precharged to the ground voltage Vss level when data '1' and data '0' are respectively sensed.

Referring to FIGS. 12C and 12D, voltage level of the reference bitline BLref is changed by Δ2 due to the capacitive coupling when the level of the plate voltage VPref of the reference cell is changed. Therefore, data '0' BL_D0 may be sensed through the reference bitline BLref whose voltage level is changed by Δ2 as illustrated in FIG. 12D. In addition, data '1' BL_D1 may be sensed through the bitline whose voltage level is changed by Δ1 due to the charge sharing between the bitline and the cell capacitor as illustrated in FIG. 12C.

In the above-mentioned example embodiments, it is described that at least one reference cell having a same configuration as the main cell is connected to each of the bitline and the complementary bitline for separating the plate voltage sources of the main cell and the reference cell. Hereinafter, there will be description on example embodiments that do not include a reference cell.

Figure 13:
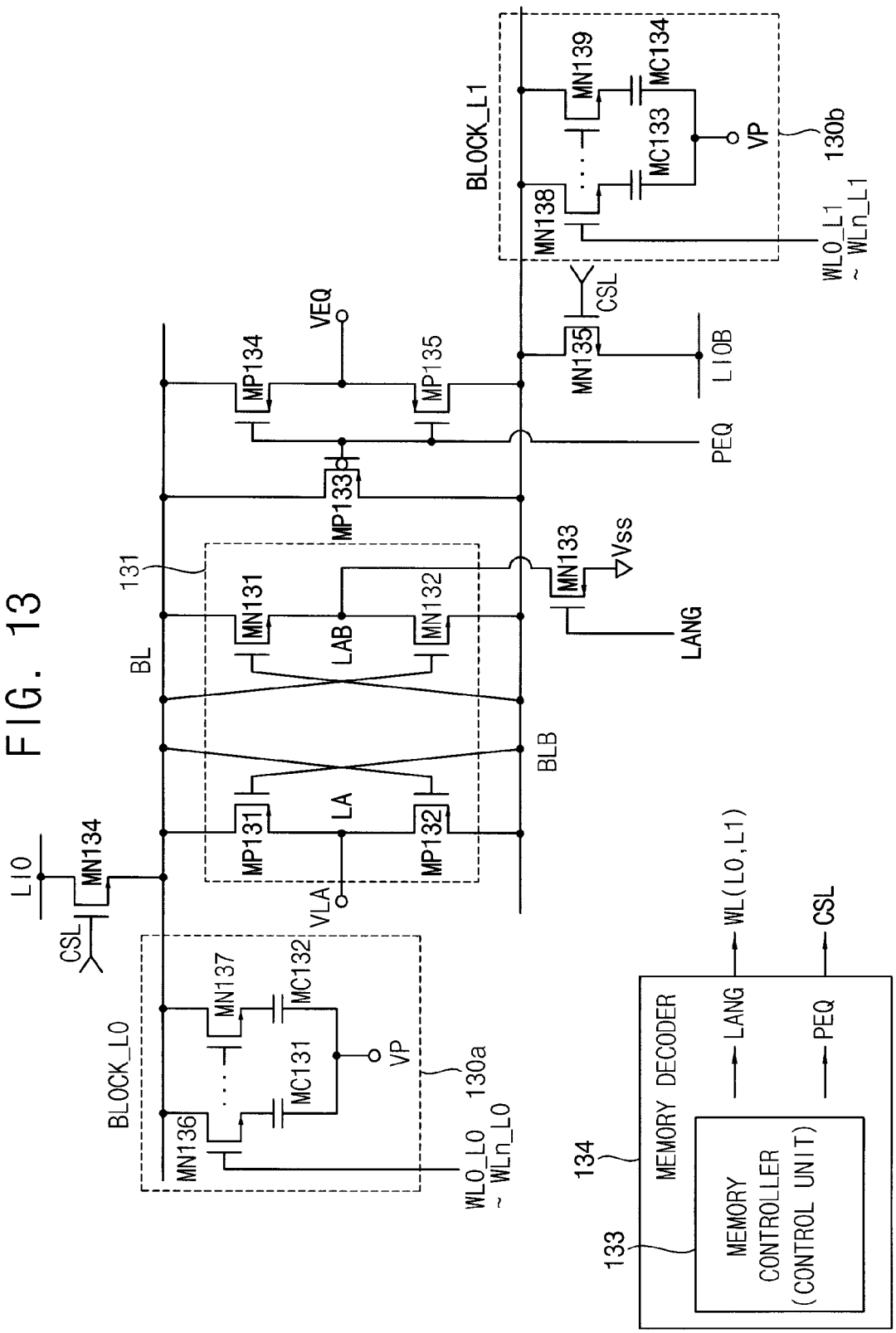
FIG. 13 is a circuit diagram illustrating an example of a DRAM according to some example embodiments.

FIG. 13 is a circuit diagram illustrating an example of a DRAM according to some example embodiments.

Referring to FIG. 13, a bitline sense amplifier may include a latch circuit 131 including PMOS transistors MP131 and MP132 and NMOS transistors MN131 and MN132. Sources of the PMOS transistors MP131 and MP132 are commonly connected to a bias source VLA. Configuration of the latch circuit 131 is substantially the same as the latch circuit 32 in FIG. 3, and thus detailed description on configuration of the latch circuit 131 will be omitted.

Biasing NMOS transistor MN133 is connected between the bias node LAB and a lower bias voltage source such as the ground voltage Vss. The biasing NMOS transistor MN133 has a source connected to the lower bias voltage source such as the ground voltage Vss and a gate controlled by a bias control signal LANG.

PMOS transistor MP133 is connected between the bitline BL and the complementary bitline BLB, the PMOS transistor MP133 has a gate controlled by an equalizing control signal PEQ to equalize the bitline BL and the complementary bitline BLB. PMOS transistors MP134 and MP135 are connected in series between the bitline BL and the complementary bitline BLB, and sources of the PMOS transistors MP134 and MP135 are connected to a bias source VEQ. Gates of the PMOS transistors MP134 and MP135 are commonly connected to a gate of the PMOS transistor MP133 and are controlled by the equalizing control signal PEQ.

In FIG. 13, a memory cell block BLOCK_L0 and a memory cell block BLOCK_L1 are taken for example, and the memory cell block BLOCK_L0 is connected to the bitline BL and the memory cell block BLOCK_L1 is connected to the complementary bitline BLB.

The memory cell block BLOCK_L0 includes main cells 130a. The main cells 130a include a plurality of memory cells, one of the memory cells includes a switching transistor MN136 and a capacitor MC131 which are serially connected between the bitline BL and a main plate voltage source VP, and another of the memory cells includes a switching transistor MN137 and a capacitor MC132 which are serially connected between the bitline BL and the main plate voltage source VP. In addition, gates of the switching transistors MN136 and MN137 are controlled by a wordline WL0_L0 and WLn_L0, respectively.

The memory cell block BLOCK_L1 includes main cells 130b. The main cells 130b include a plurality of memory cells, one of the memory cells includes a switching transistor MN138 and a capacitor MC133 which are serially connected between the complementary bitline BLB and the main plate voltage source VP, and another of the memory cells includes a switching transistor MN139 and a capacitor MC134 which are serially connected between the complementary bitline BLB and the main plate voltage source VP. In addition, gates of the switching transistors MN138 and MN139 are controlled by a wordline WL0_L1 and WLn_L1, respectively.

A column selection transistor MN134 is connected between the bitline BL and a local input/output (I/O) LIO, and a gate of the column selection transistor MN134 is controlled by a column selection line CSL. A column selection transistor MN135 is connected between the complementary bitline BLB and a complementary local I/O LIOB, and a gate of the column selection transistor MN135 is controlled by the column selection line CSL.

The column selection transistors MN134 and MN135 are turned on/off in response to the column selection line CSL. When the main memory cells 130a and 130b are selected and accessed by a memory decoder 134, the column selection line CSL has a logic high level and the bitline BL is connected to the local I/O LIO and the complementary bitline BLB is connected to the complementary local I/O LIOB.

For example, the memory decoder 134 decodes addresses to generate the column selection line CSL signal for selecting the memory cells 130a and 130b, wordline WL0_L0~WLn_L0/complementary wordline WL0_L1~WLn_L1 signals and reference wordline WLref_L0/complementary reference wordline WLref_L1 signals.

In addition, the memory decoder 134 may include a memory controller (or control unit) 133. The memory controller 133 may be a part of the memory decoder 134, and the memory controller 133 may generate the bias control signal LANG and the equalizing control signal PEQ.

The DRAM device of FIG. 13 may operate with a power supply voltage whose level is equal to or lower than 1 volt, when the bitline is precharged to the power supply voltage Vdd level. As such, restoring high voltage having a level not less than double of the power supply voltage may be stored in cells in precharge operation such that charge sharing voltage is secured for sensing data in case of decrease of capacitance of a cell capacitor. For example, the bias voltage VLA may be restored from the power supply voltage Vdd to double the power supply voltage Vdd in a precharge operation, and a level of the bias voltage VLA transitions transitioned from the double of the power supply voltage Vdd to the power supply voltage Vdd in equalizing the bitline.

Figure 14:
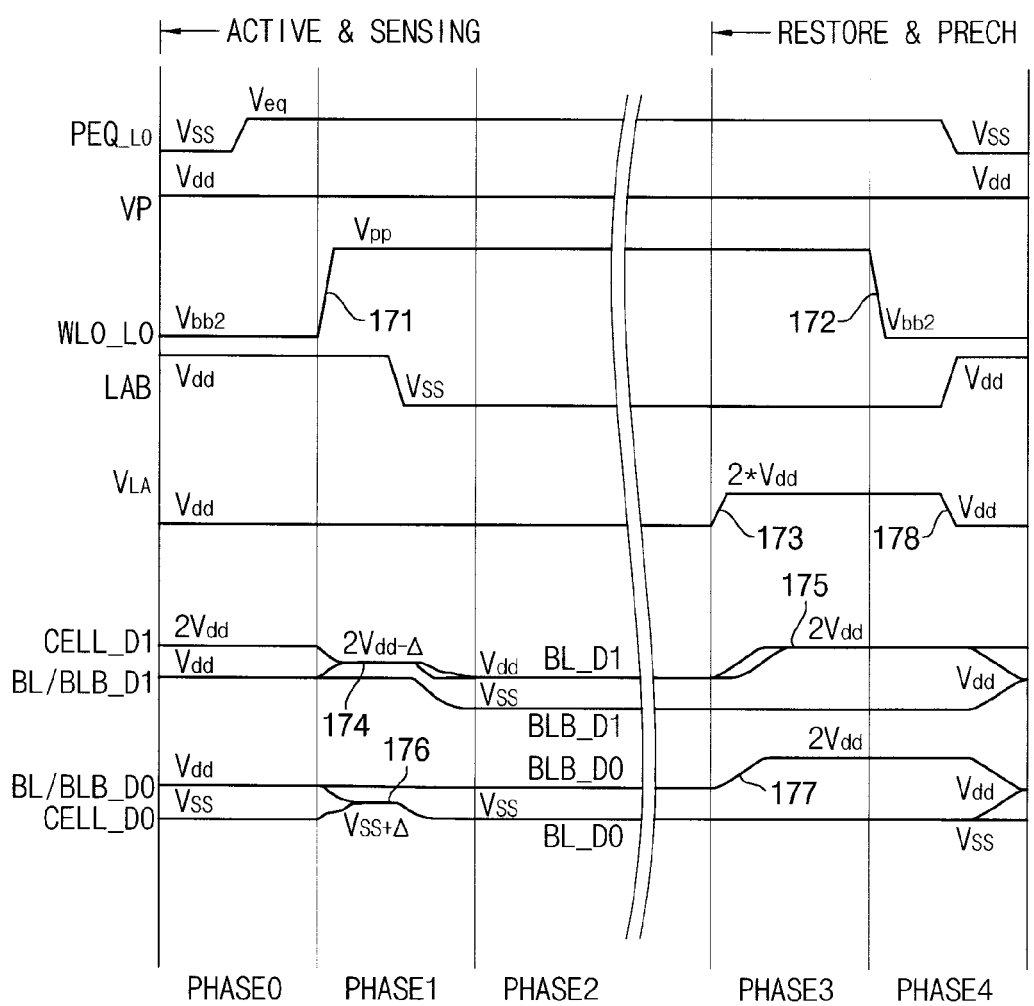
FIG. 14 is a timing diagram illustrating operation of the DRAM of FIG. 13 according to example embodiments.

FIG. 14 is a timing diagram illustrating operation of the DRAM of FIG. 13 according to example embodiments.

Hereinafter, data sensing in the DRAM will be described with reference to FIGS. 13 and 14.

In one embodiment, the bitline BL is precharged to a level of the power supply voltage Vdd corresponding to a voltage level of data '1'. In addition, the level of the plate voltage VP of the main cells 130a and 130b is maintained at half of the power supply voltage Vdd, that is, Vdd/2.

First, there will be description on operation of an unselected memory block in a standby mode.

A level of the wordline WL0_L0 of a main cell is maintained at a lower voltage Vbb2 level. The higher voltage Vpp may have a level equal to or higher than the power supply voltage Vdd. The lower voltage Vbb may have a level equal to or lower than the ground voltage Vss.

Second, there will be description on operation of a selected memory block, for example, the memory block BLOCK_L0 in FIG. 13.

In an active mode (denoted by 'RAS ACTIVE') during phases PHASE0, PHASE1 and PHASE2, a level of a wordline WL0_L0 of the main cell, on which write operation or read operation will be performed, transitions from a lower voltage Vbb2 level to a higher voltage Vpp level as represented by a reference numeral 171, and thus, a corresponding switching transistor of the main cell (for example, switching transistor MN137) is turned on. As described above, the cell CELL_D1 storing data '1' has voltage level of 2 Vdd because the voltage of 2 Vdd is restored in the main cell in precharge operation.

When the level of the wordline WL0_L0 of the main cell transitions from the lower voltage Vbb2 level to the higher voltage Vpp level as represented by a reference numeral 171, charge sharing occurs between the cell capacitance CS and the bitline capacitance CB as represented by reference numerals 174 or 176. The reference numeral 174 corresponds to data '1', and the reference numeral 176 corresponds to data '0'.

In a precharge mode (denoted by 'RAS PRECH') during phases PHASE3 and PHASE4, the main cell is disable, and the level of the wordline WL0_L0 of the main cell transitions from the higher voltage Vpp level to the lower voltage Vbb2 level as represented by a reference numeral 172. In addition, the level of the bias voltage VLA transitions from the power supply voltage Vdd to double the power supply voltage 2 Vdd as represented by a reference numeral 173, and data corresponding to the voltage of 2 Vdd is restored in the main cell.

When the bitline is equalized, the level of the bias voltage VLA transitions from the double of power supply voltage 2 Vdd to the power supply voltage Vdd as represented by a reference numeral 178, and the voltage level of the bitline BL is precharged to the power supply Vdd level.

A voltage level of the complementary bitline BLB_D0 corresponding to data '0' is maintained at the power supply voltage Vdd level after electrical charges are shared represented by a reference numeral 176, and the voltage level of the complementary bitline BLB_D0 transitions to the double of the power supply voltage 2 Vdd in precharge operation as represented by a reference numeral 177.

In DRAM device employing configuration of FIG. 13, the change of the voltage level of the reference bitline, for example, the complementary bitline, corresponds to 2 Vdd−Δ in case of data '1' and corresponds to 2 Vss+Δ in case of data '0' by setting the main cell to have voltage level corresponding to 2 Vdd for data '1' and to have voltage level corresponding to Vss for data '0' and by setting the reference bitline, for example, the complementary bitline, to have voltage level corresponding to Vdd. Therefore, self-reference data sensing is possible through the bitline and the complementary bitline having the power supply voltage Vdd level.

The above-mentioned example embodiments are mainly described with respect to DRAM device. However, the above-mentioned example embodiments may be also applicable to other volatile memory devices such as SRAM devices. In addition, the above-mentioned example embodiments may be also applicable to open-bitline or folded-bitline architecture.

Figure 15A:
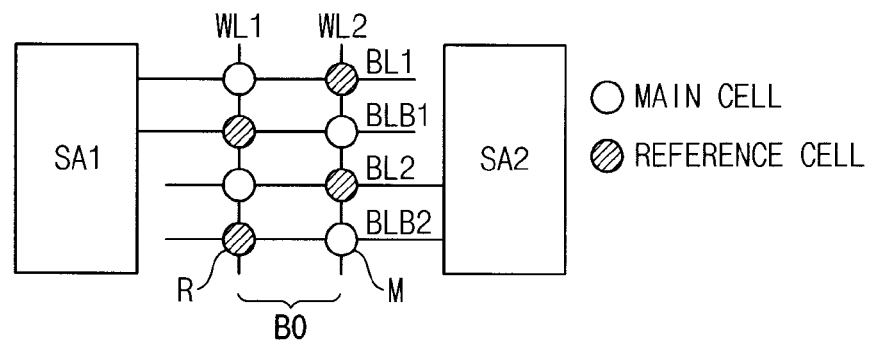
FIG. 15A illustrates a DRAM device employing folded-bitline architecture according to some example embodiments.

FIG. 15A illustrates a DRAM device employing folded-bitline architecture according to some example embodiments.

Referring to FIG. 15A, main cells M and reference cells R included in a cell block B0 are arranged at each of areas intersected by wordlines WL1 and WL2, a pair of bitline BL1 and complementary bitline BLB1 which are alternatively arranged, and a pair of bitline BL2 and complementary bitline BLB2 which are alternatively arranged. A bitline sense amplifier SA1 is connected to the pair of bitline BL1 and complementary bitline BLB1, and another bitline sense amplifier SA2 is connected to the pair of bitline BL2 and complementary bitline BLB2.

Although not illustrated, the reference cells R may be controlled by separate reference wordlines in FIG. 15A.

In the DRAM device employing the folded-bitline architecture as illustrated in FIG. 15A, since the bitlines BL1 and BL2 and the complementary bitlines BLB1 and BLB2 are arranged in the same block (or same array) B0, the bitlines BL1 and BL2 have same coupling noise with the wordlines WL1 and WL2 as the complementary bitlines BLB1 and BLB2 have with the wordlines WL1 and WL2. Therefore, the DRAM device employing the folded-bitline architecture may enhance a sensing margin because such common mode noise may be cancelled by differential amplification of the bitline sense amplifiers SA1 and SA2.

Figure 15B:
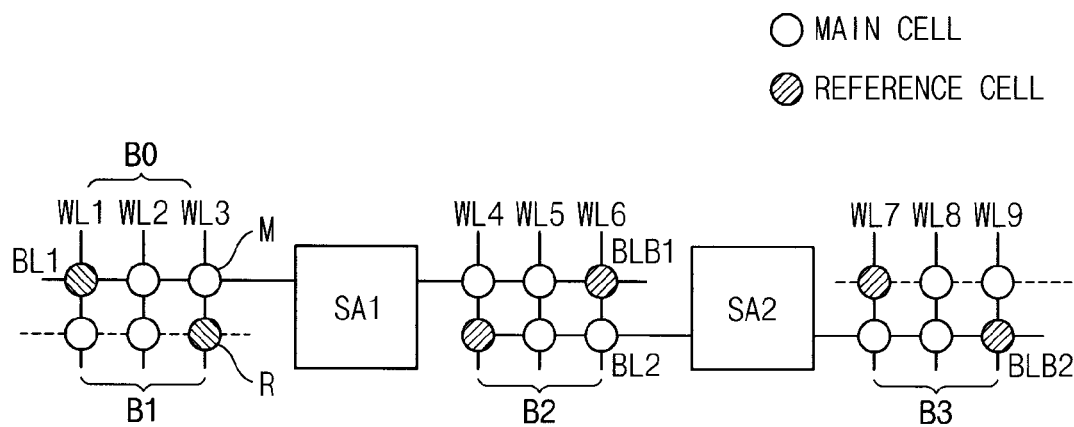
FIG. 15B illustrates a DRAM device employing open-bitline architecture according to some example embodiments.

FIG. 15B illustrates a DRAM device employing open-bitline architecture according to some example embodiments.

Referring to FIG. 15B, main cells M and reference cells R included in cell blocks B1, B2 and B3 are arranged at each of areas intersected by wordlines WL1~WL9, a pair of bitline BL1 and complementary bitline BLB 1 which are alternatively arranged and a pair of bitline BL2 and complementary bitline BLB2 which are alternatively arranged. A bitline sense amplifier SA1 is connected to the pair of bitline BL1 and complementary bitline BLB1, and another bitline sense amplifier SA2 is connected to the pair of bitline BL2 and complementary bitline BLB2.

In the DRAM device employing the open-bitline architecture as illustrated in FIG. 15B, since the bitlines BL1 and BL2 are arranged in different blocks B1 and B2, and the complementary bitlines BLB1 and BLB2 are arranged in different blocks B2 and B3 such that the pair of the bitline and the complementary bitline are in different electrical circumstances, accurate design is required for sensing delicate signals. The main cells are arranged at each of areas by the wordlines and the bitlines in the DRAM device employing the open-bitline architecture, and thus, the bitline BL1 and complementary bitline BLB1 are arranged at either sides of the bitline sense amplifier SA1 and the bitline BL2 and complementary bitlines BLB2 are arranged at either sides of the bitline sense amplifier SA2. Therefore, the DRAM device employing the folded-bitline architecture may enhance sensing margin because such common mode noise may be cancelled by differential amplification of the bitline sense amplifiers SA1 and SA2. Since the main cells are arranged at each of areas by the wordlines and the bitlines in the DRAM device employing the open-bitline architecture, the DRAM device employing the open-bitline architecture may have higher integration rate. Although not illustrated, the reference cells R may be controlled by separate reference wordlines in FIG. 15B.

Figure 16:
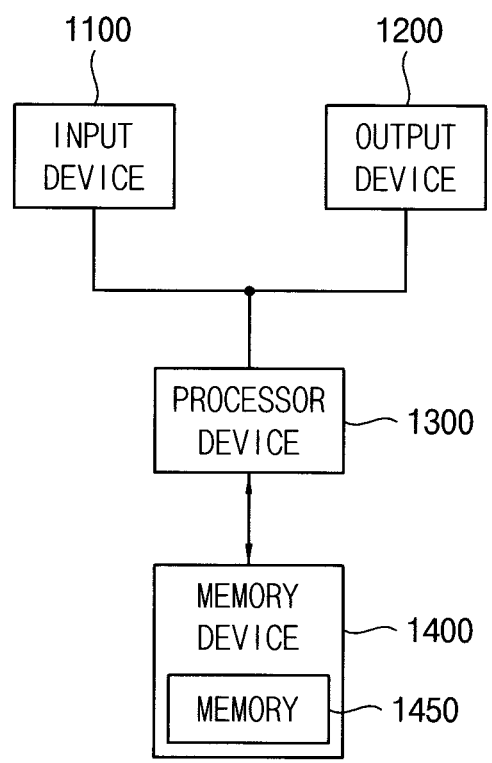
FIG. 16 is a block diagram illustrating an electronic system including the semiconductor memory device according to some example embodiments.

FIG. 16 is a block diagram illustrating an electronic system including the semiconductor memory device according to some example embodiments.

Referring to FIG. 16, an electronic system 1000 includes an input device 1100, an output device 1200, a processor device 1300 and a memory device 1400. The memory device 1400 may include a memory such as the memory according to one of the example embodiments discussed previously.

The processor device 1300 controls the input device 1100, the output device 1200, and the memory device 1400 through corresponding interfaces.

Figure 17:
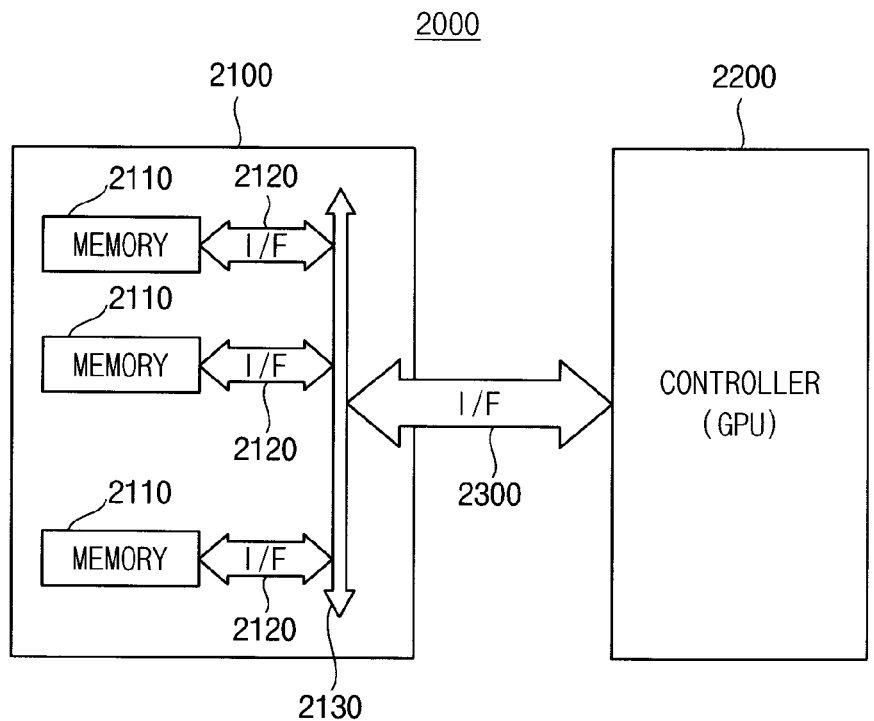
FIG. 17 is a block diagram illustrating a graphic memory system according to some example embodiments.

FIG. 17 is a block diagram illustrating a graphic memory system according to some example embodiments.

Referring to FIG. 17, a graphic memory system 2000 includes a memory group 2100, a controller 2200 such as a graphic processor unit (GPU) for controlling the memory group 2100, and a system bus 2300 connected between the memory group 2100 and the controller 2200. The memory group 2100 includes a plurality of memories 2110, an internal interface 2130 and memory interfaces 2120.

The controller 2200 may include a graphic engine core, and exchanges data with the memory group 2100. The system bus 2300, the internal interface 2130, and the memory interfaces 2120 may be integrated into one I/O, or may be separated. In addition, the system bus 2300, the internal interface 2130 ad the memory interfaces 2120 may have data format that is varied based on architecture of an application system.

Figure 18:
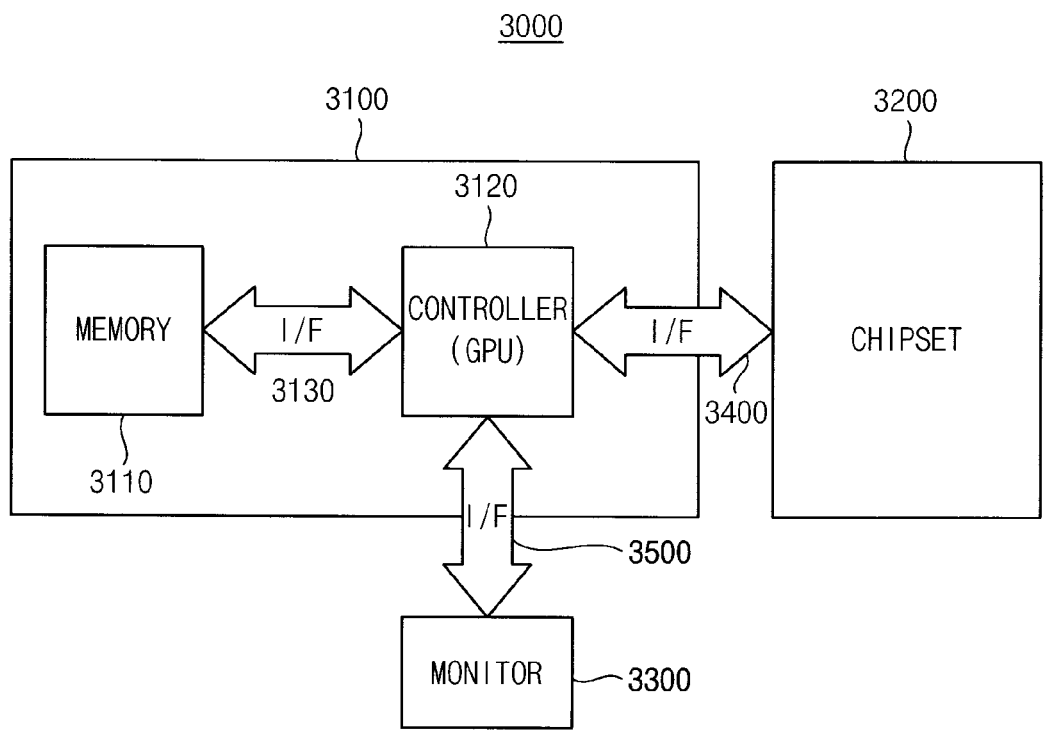
FIG. 18 is a block diagram illustrating a graphic card system including the graphic memory system of FIG. 17 according to some example embodiments.

FIG. 18 is a block diagram illustrating a graphic card system including the graphic memory system of FIG. 17 according to some example embodiments.

Referring to FIG. 18, a graphic card system 3000 includes a graphic memory system 3100, a chipset 3200 a monitor 3300, a first interface 3400 and a second interface 3500. The graphic memory system 3100 may include a memory 3110, a controller 3120 such as a graphic processor unit (GPU) for controlling the memory 3110 and a system bus 3130 connected between the memory 3110 and the controller 3120 such as described above. The controller 3120 exchanges data with the monitor 3300 through the second interface 3500 and the monitor 3300 receives image data and displays the received image data. The controller 3120 exchanges data with the chipset 3200 through the first interface 3400.

Each of the first and second interfaces 3400 and 3500 may use an interface protocol satisfying, for example, one of Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface ESDI, and Integrated Drive Electronics (IDE).

Figure 19:
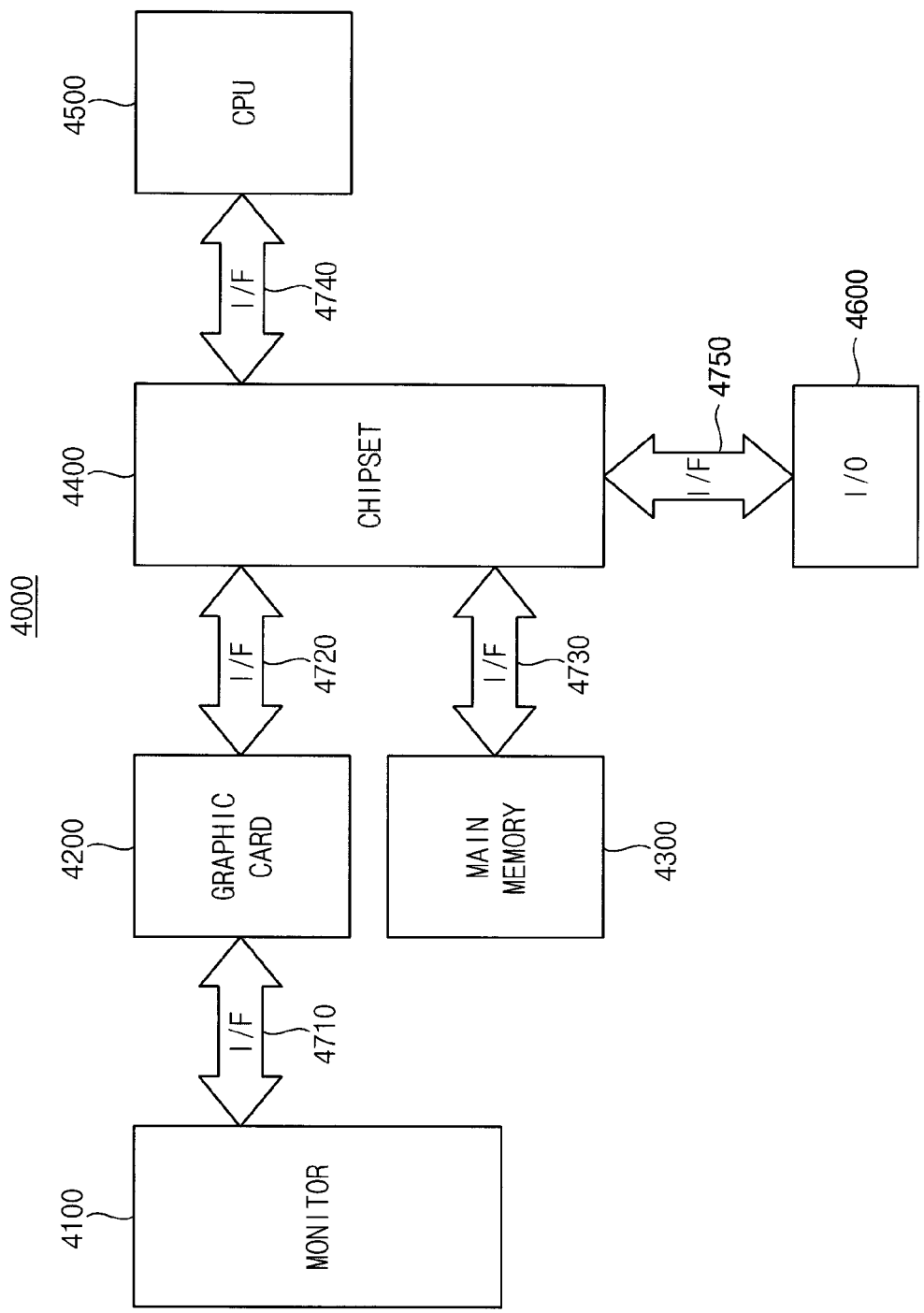
FIG. 19 is a block diagram illustrating a computing system including the graphic card system of FIG. 18 according to some example embodiments.

FIG. 19 is a block diagram illustrating a computing system including the graphic card system of FIG. 18 according to some example embodiments.

Referring to FIG. 19, a computing system 4000 includes a monitor 4100, a graphic card 4200, a main memory 4300, a chipset 4400, an input/output device 4600 and a central processing unit (CPU) 4500, which are connected to each other through system buses 4710, 4720, 4730, 4740 and 4750.

The graphic card 4200 may employ the graphic memory system 3100 of FIG. 18 and the main memory 4300 may be mounted on the computing system 4000 in a configuration of memory modules.

When the computing system 4000 is a mobile device, a battery for providing operating voltage of the computing system 4000 may be further included in the computing system 4000. Although not illustrated, the computing system 4000 may further include an application chipset, a camera image processor (CIP) and a mobile DRAM.

The memory system and the computing system according to some example embodiments may be mounted on a printed circuit board (PCB) by using various packages. These various packages may include, for example, PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package) and WSP (Wafer-Level Processed Stack Package). In addition, the memory system and the computing system according to some example embodiments may include a cell phone, PDA, tablet computer, laptop, desktop computer, etc.

Figure 20:
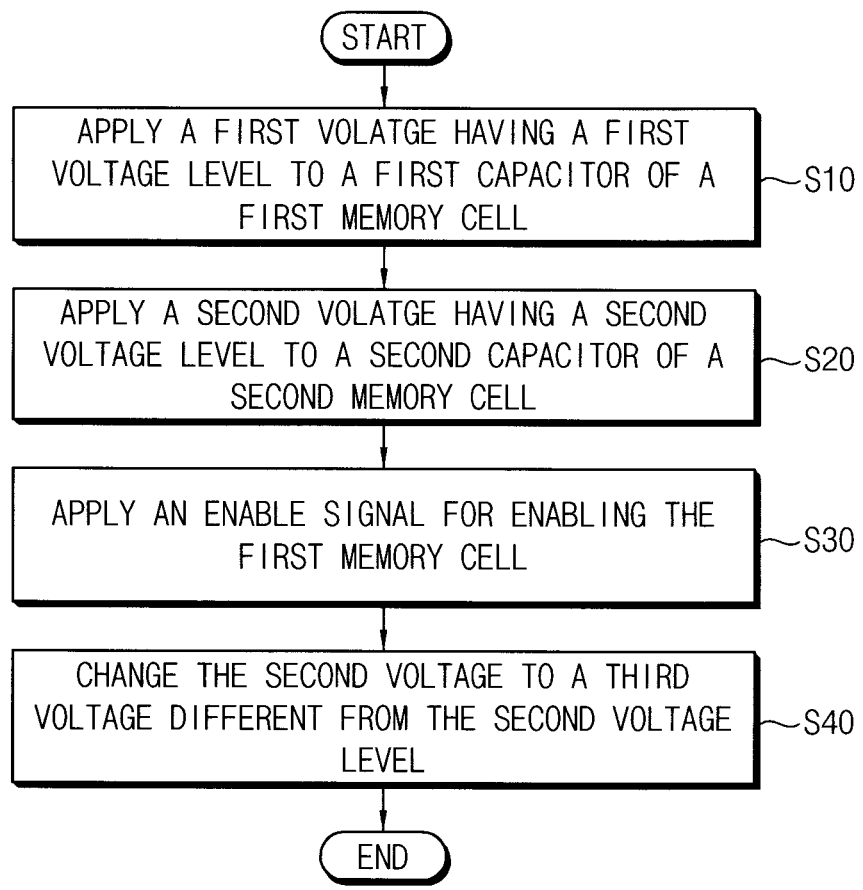
FIG. 20 is a flowchart illustrating a method of operating a semiconductor memory device according to some example embodiments.

FIG. 20 is a flowchart illustrating a method of operating a semiconductor memory device according to some example embodiments.

Referring to FIG. 4 and FIG. 20, in an active mode for reading operation, a first voltage having a first voltage level is applied to a first capacitor of a first memory cell (S10). In one embodiment, the first voltage level is half voltage of a power supply voltage. At that time, a second voltage having a second voltage level is applied to a reference capacitor of a reference memory cell (S20). When the word line of the first memory cell is enabled (S30), the second voltage is transitioned to a third voltage level (S40). The third voltage level is different from the second voltage level. For example, in one embodiment, the second voltage level is a power supply voltage (e.g., Vdd) or a ground voltage (e.g., Vss), and the third voltage level is half voltage of the power supply voltage.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device, comprising:
    a memory cell including a first switching element and a first capacitor for storing data, the first switching element being controlled by a first wordline, the first switching element having a first terminal connected to a first terminal of the first capacitor and a second terminal connected to a first bitline, the first capacitor having a second terminal for receiving a first plate voltage; and
    a first reference memory cell including a first reference switching element and a first reference capacitor, the first reference switching element being controlled by a first reference wordline, the first reference switching element having a first terminal connected to a first terminal of the first reference capacitor and a second terminal connected to a second bitline, the first reference capacitor having a second terminal for receiving a first reference plate voltage different from the first plate voltage.

2. The semiconductor memory device of claim 1, wherein the first and second bitlines are configured to be precharged to a level of a power supply voltage or a level of a ground voltage.

3. The semiconductor memory device of claim 2, wherein the first and second bitlines are configured to operate complementarily to each other.

4. The semiconductor memory device of claim 3, wherein the semiconductor memory device is configured such that a level of the first plate voltage is maintained at a fixed voltage level and a level of the first reference plate voltage is changed when the first memory cell is enabled.

5. The semiconductor memory device of claim 3, wherein the first plate voltage has an intermediate voltage level between the power supply voltage and the ground voltage and the first reference plate voltage is maintained at a level of the power supply voltage or the ground voltage when the first memory cell is not enabled.

6. The semiconductor memory device of claim 3, wherein the first plate voltage is maintained at a level of a precharge voltage, and the first reference plate voltage is changed to have a level different from the precharge voltage, when the first memory cell is enabled.

7. The semiconductor memory device of claim 1, further comprising:
    a second reference memory cell including a second reference switching element and a second reference capacitor, the second reference switching element being controlled by a second reference wordline, the second reference switching element having a first terminal connected to a first terminal of the second reference capacitor and a second terminal connected to a third bitline, the second reference capacitor having a second terminal for receiving the first reference plate voltage.

8. The semiconductor memory device of claim 7, wherein the second bitline and the third bitline are connected to each other in response to a control signal.

9. The semiconductor memory device of claim 8, further comprising:
    an averaging circuit configured to connect the second and third bitlines in response to the control signal.

10. The semiconductor memory device of claim 7, wherein the first reference wordline and second reference wordline are connected to each other.

11. A semiconductor memory device comprising:
    a first memory cell including a first switching element and a first capacitor for storing data, the first switching element being controlled by a first wordline, the first switching element having a first terminal connected to a first terminal of the first capacitor and a second terminal connected to a first bitline, the first capacitor having a second terminal for receiving a first plate voltage;
    a first reference memory cell including a first reference switching element and a first reference capacitor, the first reference switching element being controlled by a first reference wordline, the first reference switching element having a first terminal connected to a first terminal of the first reference capacitor and a second terminal connected to the first bitline, the first reference capacitor having a second terminal for receiving a first reference plate voltage different from the first plate voltage;
    a second memory cell including a second switching element and a second capacitor for storing data, the second switching element being controlled by a second wordline, the second switching element having a first terminal connected to a first terminal of the second capacitor and a second terminal connected to a second bitline, the second capacitor having a second terminal for receiving the first plate voltage; and
    a second reference memory cell including a second reference switching element and a second reference capacitor, the second reference switching element being controlled by a second reference wordline, the second reference switching element having a first terminal connected to a first terminal of the second reference capacitor and a second terminal connected to the second bitline, the second reference capacitor having a second terminal for receiving a second reference plate voltage different from the first plate voltage.

12. The semiconductor memory device of claim 11, wherein the first and second bitlines are configured to be precharged to a level of a power supply voltage or a level of a ground voltage.

13. The semiconductor memory device of claim 12, wherein the semiconductor memory device is configured such that the first and second bitlines operate complementarily to each other, a level of the first word line and a level of the second reference plate voltage are simultaneously changed, and a level of the second word line and a level of the first reference plate voltage are simultaneously changed.

14. The semiconductor memory device of claim 13, wherein the semiconductor memory device is configured such that when the first memory cell or the second memory cell is enabled, a level of the first plate voltage is maintained at a fixed voltage level, and a level of the second reference plate voltage or the first reference plate voltage is changed, respectively.

15. The semiconductor memory device of claim 13, wherein the semiconductor memory device is configured such that when the first memory cell or the second memory cell is enabled, the first plate voltage has an intermediate voltage level between the power supply voltage and the ground voltage, and a level of the second reference plate voltage or the first reference plate voltage is changed, respectively.

16. The semiconductor memory device of claim 13, wherein the semiconductor memory device is configured such that when the first memory cell or the second memory cell is enabled, the first plate voltage has an intermediate voltage level between the power supply voltage and the ground voltage, and a level of the first plate voltage has a level of the power supply voltage or the ground voltage.

17. The semiconductor memory device of claim 11, further comprising:
a third reference memory cell including a third reference switching element and a third reference capacitor, the third reference switching element being controlled by a third reference wordline, the third reference switching element having a first terminal connected to a first terminal of the third reference capacitor and a second terminal connected to a third bitline, the second capacitor having a second terminal for receiving the first reference plate voltage.

18. The semiconductor memory device of claim 17, wherein the first bitline and the third bitline are connected to each other in response to a first control signal.

19. The semiconductor memory device of claim 18, further comprising:
a first averaging circuit configured to connect the first and third bitlines in response to the first control signal.

20. The semiconductor memory device of claim 17, wherein the first reference wordline and the third reference wordline are connected to each other.

21. The semiconductor memory device of claim 11, further comprising:
a fourth reference memory cell including a fourth reference switching element and a fourth reference capacitor, the fourth reference switching element being controlled by a fourth reference wordline, the fourth reference switching element having a first terminal connected to a first terminal of the fourth reference capacitor and a second terminal connected to a fourth bitline, the fourth reference capacitor having a second terminal.

22. The semiconductor memory device of claim 21, wherein the second bitline and the fourth bitline are connected to each other in response to a second control signal.

23. The semiconductor memory device of claim 22, further comprising:
a second averaging circuit configured to connect the second and fourth bitlines in response to the second control signal.

24. The semiconductor memory device of claim 21, wherein the second reference wordline and the fourth reference wordline are connected to each other.

* * * * *